United States Patent
Duryea et al.

(10) Patent No.: US 9,960,777 B2
(45) Date of Patent: *May 1, 2018

(54) DIAGNOSTIC MONITORING FOR ANALOG-TO-DIGITAL CONVERTERS

(71) Applicant: Texas Instruments Incorporated, Dallas, TX (US)

(72) Inventors: Timothy Paul Duryea, Dallas, TX (US); Vaibhav Garg, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/333,659

(22) Filed: Oct. 25, 2016

(65) Prior Publication Data

US 2017/0047936 A1 Feb. 16, 2017

Related U.S. Application Data

(63) Continuation of application No. 14/706,762, filed on May 7, 2015, now Pat. No. 9,509,325.

(51) Int. Cl.
*H03M 1/38* (2006.01)
*H03M 1/06* (2006.01)
(Continued)

(52) U.S. Cl.
CPC ...... *H03M 1/0607* (2013.01); *H03K 19/0005* (2013.01); *H03M 1/1076* (2013.01);
(Continued)

(58) Field of Classification Search
CPC .... H03M 1/0607; H03M 1/44; H03M 1/1245; H03M 1/1076; H03M 1/122; H03K 19/0005
(Continued)

(56) References Cited

U.S. PATENT DOCUMENTS

| 7,489,263 B1 | 2/2009 | Drakshapalli et al. | |
|---|---|---|---|
| 7,796,069 B2 * | 9/2010 | Li | H03M 3/474 341/122 |

(Continued)

OTHER PUBLICATIONS

Notification of Transmittal of the International Search Report and the Written Opinion of the International Searching Authority, or the Declaration, dated Aug. 18, 2016.

*Primary Examiner* — Brian Young
(74) *Attorney, Agent, or Firm* — Tuenlap D. Chan; Charles A. Brill; Frank D. Cimino

(57) ABSTRACT

The present disclosure describes a channel selector for use in an analog-to-digital converter that has a sampling circuit for converting an analog input to a digital output within a fault tolerance range. The channel selector includes a reception channel, a diagnostic channel, and an impedance compensator. The reception channel receives an analog signal for delivery to the sampling circuit when it is selected for coupling with the sampling circuit. The diagnostic channel receives a diagnostic signal for verifying the digital output of the sampling circuit when it is selected for coupling with the sampling circuit. The impedance compensator is configured to offset a high channel impedance of the reception channel based on the fault tolerance range of the sampling circuit and when the diagnostic channel is selected.

25 Claims, 5 Drawing Sheets

(51) Int. Cl.
*H03K 19/00* (2006.01)
*H03M 1/10* (2006.01)
*H03M 1/44* (2006.01)
*H03M 1/12* (2006.01)

(52) U.S. Cl.
CPC .......... *H03M 1/1245* (2013.01); *H03M 1/44* (2013.01); *H03M 1/122* (2013.01)

(58) Field of Classification Search
USPC ........................................ 341/155, 159, 161
See application file for complete search history.

(56) References Cited

U.S. PATENT DOCUMENTS

| | | | |
|---|---|---|---|
| 7,944,384 B2 * | 5/2011 | Fredriksen | H03M 1/1225 341/141 |
| 8,416,110 B2 * | 4/2013 | Tsai | G11C 27/024 341/122 |
| 8,547,271 B2 * | 10/2013 | De Geronimo | H03M 1/125 341/122 |
| 8,884,629 B1 | 11/2014 | Kumar et al. | |
| 9,270,293 B2 * | 2/2016 | Mandal | H03M 1/1245 |
| 9,306,790 B1 * | 4/2016 | Strode | |
| 2009/0184761 A1 | 7/2009 | Reynaert et al. | |

* cited by examiner

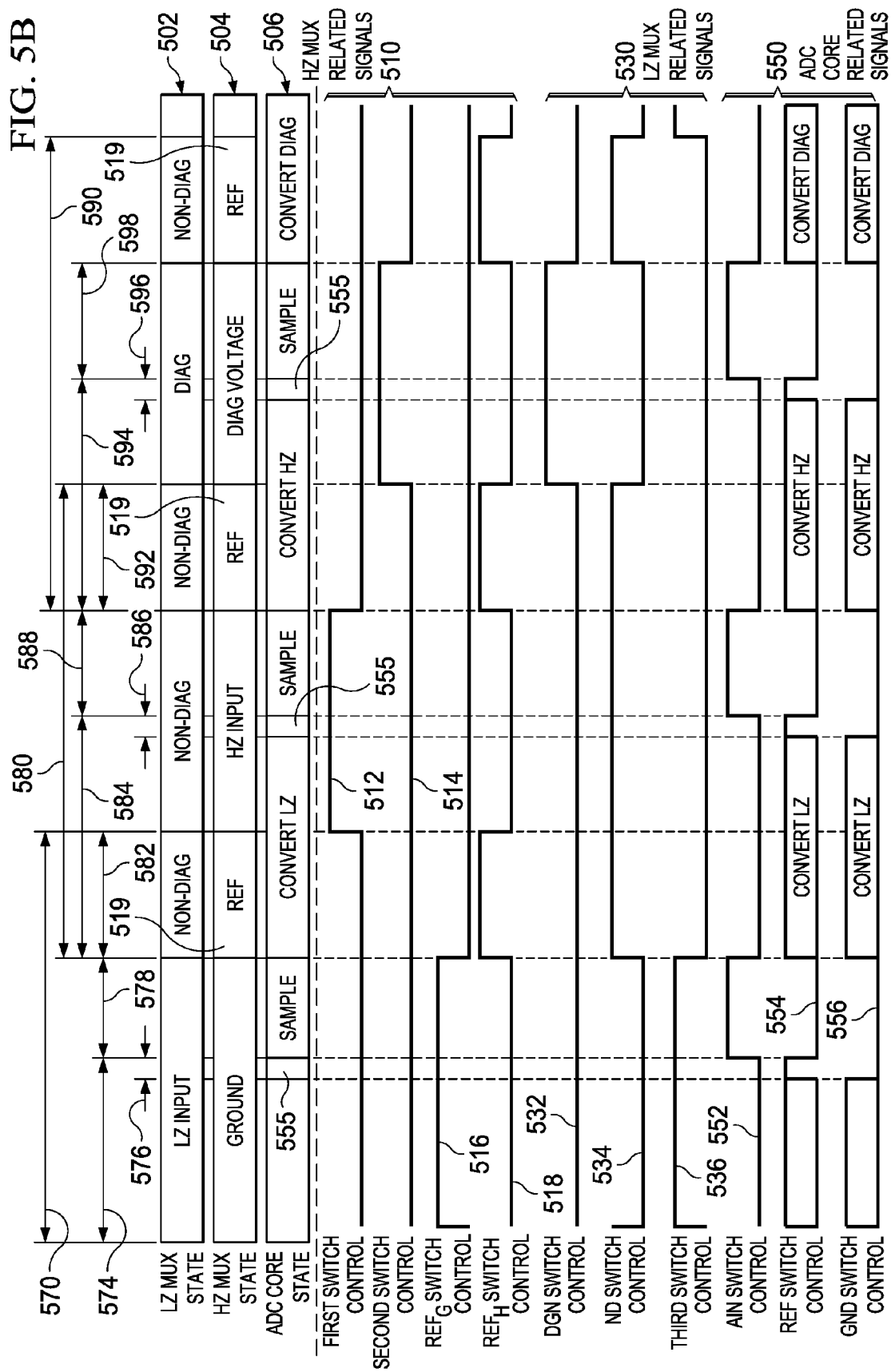

DIAGNOSTIC MONITORING FOR ANALOG-TO-DIGITAL CONVERTERS

CROSS-REFERENCE TO RELATED APPLICATIONS

Under 35 U.S.C. § 120, this continuation application claims priority to and benefits of U.S. patent application Ser. No. 14/706,762 (TI-73043), filed on May 7, 2015, the entirety of which is hereby incorporated herein by reference.

BACKGROUND

The demand for functional safety requirements continues to rise in high reliability applications, such as electronic applications for use in the automotive industry. These functional safety requirements specify that safety critical circuits should have the ability to detect and react to single point failures that may lead to malfunctions of the overall system. Among other components, a safety critical circuit may include a multi-input analog-to-digital converter (ADC) that processes analog input signals. Typically, a multi-input ADC includes a multiplexer and a core circuit. The multiplexer selects an analog input from multiple input channels, while the core circuit samples the selected input channel. Conventional diagnostic schemes primarily focus on fault detection of the core circuit but provide little to no coverage on the multiplexer side. To meet the increasing demand for function safety, there is a need for a diagnostic scheme that provides more comprehensive coverage on systems incorporating ADC devices.

SUMMARY

The present disclosure describes systems and techniques relating to diagnostic monitoring systems and techniques for detecting faults in analog-to-digital converters (ADCs). The disclosed diagnostic monitoring systems and techniques provide continuous diagnostic coverage on several input stages of an ADC core circuit, which include but are not limited to a channel multiplexer and a channel buffer. Accordingly, the disclosed systems and techniques are able to detect a wide range of runtime malfunctions of an ADC, including core malfunctions, buffer malfunctions, multiplexer stuck-open malfunctions, and multiplexer stuck-closed malfunctions.

In one implementation, the present disclosure describes a channel selector for use in an analog-to-digital converter that has a sampling circuit for converting an analog input to a digital output within a fault tolerance range. The channel selector includes a reception channel, a diagnostic channel, and an impedance compensator. The reception channel receives an analog signal for delivery to the sampling circuit when it is selected for coupling with the sampling circuit. The diagnostic channel receives a diagnostic signal for verifying the digital output of the sampling circuit when it is selected for coupling with the sampling circuit. The impedance compensator is configured to offset a high channel impedance of the reception channel based on the fault tolerance range of the sampling circuit and when the diagnostic channel is selected.

In another implementation, the present disclosure describes a channel selector for use in an analog-to-digital converter that includes a sampling circuit for converting an analog input to a digital output within a fault tolerance range. The channel selector includes a reception channel, a diagnostic channel, a first switch, a second switch, and an impedance compensator. The reception channel has high channel impedance, and the reception channel is configured to receive an analog signal. While being closed, the first switch is configured to selectively couple the reception channel with the sampling circuit. The diagnostic channel is configured to receive a diagnostic signal for verifying the digital output of the sampling circuit. While being closed, the second switch is configured to selectively couple the diagnostic channel with the sampling circuit. The impedance compensator is configured to offset the high channel impedance of the reception channel when the first switch is stuck closed. The structural configuration of the impedance compensator is based on the fault tolerance range of the sampling circuit and when the diagnostic channel is selected.

In yet another implementation, the present disclosure describes an analog-to-digital converter (ADC) that includes a sampling circuit and a channel selector. The sampling circuit is configured to convert an analog input to a digital output within a fault tolerance range. The channel selector is configured to select a channel to provide the analog input for the sampling circuit. The channel selector includes a reception channel, a diagnostic channel, a switch, and an impedance compensator. The reception channel is configured to receive an analog signal, and the reception channel has a certain amount of channel impedance. The diagnostic channel is configured to receive a diagnostic signal for verifying the digital output of the sampling circuit. The switch is coupled with the reception channel and the diagnostic channel, such that the switch is configured to select the reception channel or the diagnostic channel for providing the analog input to the sampling circuit. The impedance compensator is coupled with the switch, such that the impedance compensator is configured to offset the channel impedance of the reception channel when the diagnostic channel is selected but the reception channel is stuck connected with sampling circuit. The structural configuration of the impedance compensator is based on the fault tolerance range of the sampling circuit.

In still another implementation, the present disclosure describes a method for verifying a digital output of an analog-to-digital converter (ADC) having a channel selector and a sampling circuit. The channel selector is configured to select a channel for providing an analog input, while the sampling circuit is configured to convert the analog input to the digital output. The method includes isolating the sampling circuit from the selected channel during a first time period. The method also includes resetting the sampling circuit during a second time period partially overlapping with the first time period. The method moreover includes coupling the sampling circuit with the channel selector during a third time period after the second time period and outside of the first time period. Such coupling allows the sampling circuit to sample the selected channel. The method further includes converting the sampled analog input to the digital output using the sampling circuit.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus; and apparatus implementations can be realized from a disclosed system, computer-readable medium, or method. Similarly, method implementations can be realized from a disclosed system, computer-readable medium, or apparatus; and system implementations can be realized from a disclosed method, computer-readable medium, or apparatus.

For example, one or more disclosed embodiments can be implemented in various systems and apparatus, including, but not limited to, a special purpose data processing apparatus (e.g., a wireless communication device such as a wireless access point, a remote environment monitor, a router, a switch, a computer system component, a medium access unit), a mobile data processing apparatus (e.g., a wireless client, a cellular telephone, a smart phone, a personal digital assistant (PDA), a mobile computer, a digital camera), a general purpose data processing apparatus such as a computer, or combinations of these.

DRAWING DESCRIPTIONS

FIG. 5B is a timing diagram illustrating the sampling cycles of an exemplary ADC according to another aspect of the present disclosure.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
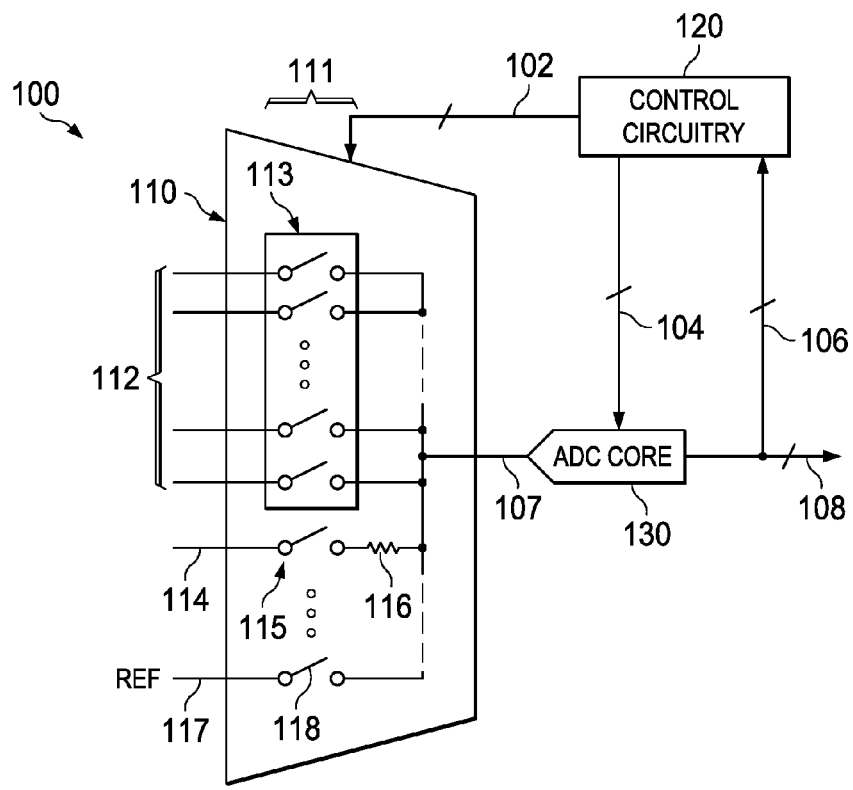
FIG. 1 shows a schematic view of an exemplary analog-to-digital (ADC) circuit according to an aspect of the present disclosure.

FIG. 1 shows a schematic view of an exemplary analog-to-digital (ADC) circuit 100 according to an aspect of the present disclosure. The ADC circuit 100 is formed within an integrated circuit either by itself or along with other systems interacting with the ADC circuit 100. The ADC circuit 100 is configured to detect several fault conditions of an integrated circuit to which the ADC circuit 100 is incorporated. The fault detection provided by the ADC circuit 100 is continuous, such that the overall system can respond to detected faults while the integrated circuit is executing other real-time applications. In general, the ADC circuit 100 includes a channel selector circuit 110 (e.g., a multiplexer), a control circuitry 120, and an ADC core circuit 130.

The ADC core circuit 130 includes a sampling circuit that is configured to sample and convert an analog input signal 107 to a digital output signal 108. In one implementation, the ADC core circuit 130 is controlled by the control circuitry 120 via one or more sampling control signal 104. The sampling control signal 104 can be used for adjusting the sampling rate of the ADC core circuit 130 as well as the resolution of the digital output signal 108. The digital output signal 108 typically includes multiple digits or bits, each carried by a single bus. The digital output signal 108 has a fault tolerance range that represents the precision of the ADC core circuit 130. Consistent with the present disclosure, the term fault tolerance range can be understood as a range of deviation in the analog input 107 that the ADC core circuit 130 can withstand for the purpose generating a consistent digital output signal 108.

For example, when the digital output signal 108 has a 4% fault tolerance range, the analog input 107 may deviate 2% above and/or 2% below the nominal voltage level from which the ADC core circuit 130 can generate a consistent digital output signal 108. More specifically, assuming that the ADC core circuit 130 is configured to convert an analog input signal 107 having a nominal voltage level of 5V, a 4% fault tolerance range allows the digital output signal 108 to deliver a consistent 8-bit digital value of 0000 0101 even when the analog input signal 107 deviates between 4.9V (i.e., 2% below 5V) and 5.1V (i.e., 2% above 5V).

The ADC circuit 100 is configured to receive analog inputs from multiple input channels. The channel selector circuit 110 serves as a means for selecting a single channel from these multiple input channels to provide the analog input signal 107 for the ADC core circuit 130. Particularly, the channel selector circuit 110 is coupled with the ADC core circuit 130, and the channel selector circuit 110 is controlled by the control circuitry 120. The channel selector circuit 110 includes an array of reception channels 112, each of which is configured to receive an analog signal. At any given of point of time, the channel selector circuit 110 selects one reception channel 112 to be coupled with ADC core circuit 130. The selected reception channel 112 provides the analog input signal 107 to the sampling circuit of the ADC core circuit 130. Due to the parasitic effects caused by bonding pads and bonding wires, the reception channel 112 may incur a certain amount of channel impedance.

The channel selector circuit 110 also includes one or more diagnostic channel 114, which is configured to receive a diagnostic signal for verifying the digital output signal 108 of the ADC core circuit 130. For instance, the ADC circuit 100 detects a fault when the digital output signal 108 does not carry a digital value that corresponds to the voltage level of the diagnostic signal received by the diagnostic channel 114. Generally, the diagnostic channel 114 can be used for detecting malfunctions in the ADC core circuit 130 as well as inadvertent coupling between an unselected reception channel (e.g., one of the reception channels 112) and the ADC core circuit 130.

Assuming the voltage levels of an unselected reception channel and the diagnostic channel 114 are different, the resulting voltage level of the analog input signal 107 will deviate from the voltage level of the diagnostic channel when both unselected reception channel and the diagnostic channel 114 are coupled to the ADC core circuit 130. As a result, the digital value carried by the digital output signal 108 is skewed by the unselected reception channel, such that the digital value does not correspond to the voltage level of the diagnostic channel 114.

A copy of the digital output signal 108 is feedback to the control circuitry 120 as the sampling monitor signal 106. When the diagnostic channel 114 is selected for coupling with the ADC core circuit 130, the control circuitry 120 is configured to compare the digital value carried by the sampling monitor signal 106 and a reference digital value corresponding to the voltage level of the diagnostic channel 114. If the sampled digital value does not match with the reference digital value, the control circuitry 120 detects a fault in the ADC core circuit 130 and/or the channel selector circuit 110.

To perform its channel selection function, the channel selector circuit 110 includes a switch circuit 111. The switch circuit 111 has a set of input ports that are coupled with the reception channels 112 and the diagnostic channel 114. The switch circuit 111 also has an output port that is coupled with the ADC core circuit 130. The switch circuit 111 is controlled by the control circuitry 120 via one or more channel selection signal 102. Accordingly, the switch circuit 111 is configured to select either the reception channel (e.g., one of the reception channels 112) or the diagnostic channel 114 for providing the analog input signal 107 to the sampling circuit of the ADC core circuit 130.

The switch circuit 111 includes a group of reception switches 113, each of which is connected between a particular reception channel 112 and the ADC core circuit 130. When one of the reception channels 112 is selected, the control circuitry 120 is configured to generate the channel selection signal 102 for directing the corresponding reception switch 113 to close. As such, the selected reception channel 112 is coupled with the ADC core circuit 130, and thus, the selected reception channel 112 is configured to deliver the analog input signal 107 to the sampling circuit of the ADC core circuit 130. When the selected reception channel 112 becomes unselected, the control circuitry 120 is configured to generate the channel selection signal 102 for directing the corresponding reception switch 113 to open. As a result, the unselected reception channel 112 is decoupled from the ADC core circuit 130 so that it may no longer provide the analog input signal 107 to the sampling circuit of the ADC core circuit 130.

The switch circuit 111 also includes a diagnostic switch 115 that is connected between the diagnostic channel 114 and the ADC core circuit 130. When the diagnostic channel 114 is selected, the control circuitry 120 is configured to generate the channel selection signal 102 for directing the diagnostic switch 115 to close. As such, the selected diagnostic channel 114 is coupled with the ADC core circuit 130, and thus, the selected diagnostic channel 114 is configured to deliver the analog input signal 107 to the sampling circuit of the ADC core circuit 130. When the selected diagnostic channel 114 becomes unselected, the control circuitry 120 is configured to generate the channel selection signal 102 for directing the corresponding diagnostic switch 115 to open. As a result, the unselected diagnostic channel 114 is decoupled from the ADC core circuit 130 so that it may no longer provide the analog input signal 107 to the sampling circuit of the ADC core circuit 130.

As described above, some reception channels 112 may incur a certain amount of channel impedance because of parasitic effects. When a reception channel 112 is not selected, the control circuitry 120 directs the corresponding reception switch 113 to resume an open position, such that the unselected reception channel 112 is not coupled with the ADC core 130. However, if the corresponding reception switch 113 is faulty, it may not be able to resume the open position. In other words, the reception switch 113 suffers from a stuck-closed defect.

By selectively coupling the diagnostic channel 114 to the ADC core circuit 130, the control circuitry 120 is configured to detect the stuck-closed defect associated with the group of reception switches 113. However, in circuit environments where the reception channels 112 incur a large amount of channel impedance, the control circuitry 120 may have a difficult time in detecting this type of stuck-closed defects. In particularly, the high impedance of an unselected reception channel 112 degrades or retards the impact of the unselected reception channel 112 on the resulting voltage level in the analog input signal 107.

As a result, even when the unselected reception channel 112 is coupled with the ADC core 130, the voltage level of the unselected reception channel may have little to no effect on the sampling and digital conversion of the diagnostic channel 114. This is because the voltage variance introduced by the unselected reception channel 112 is within the fault tolerance range of the ADC core circuit 130. Accordingly, the ADC core circuit 130 may still generate a digital value that corresponds to the voltage level of the diagnostic channel 114. Upon receiving the sampling monitor signal 106 that carry such a digital value, the control circuitry 120 will be unable to detect the stuck-closed defect associated with the unselected reception channel 112 and the corresponding reception switch 113.

To prevent the stuck-closed defects from being undetected, the channel selector circuit 110 includes an impedance compensator 116 that is structured and configured to offset the high impedance of the reception channels 112. In one circuit configuration, the impedance compensator 116 is coupled with the diagnostic switch 115. The impedance compensator 116 may be coupled to either side of the diagnostic switch 115. In one implementation, for example, the impedance compensator 116 is coupled in series between the output port of the diagnostic switch 115 and the sampling circuit of the ADC core circuit 130. In another implementation, for example, the impedance compensator is 116 is coupled in series between the diagnostic channel 114 and the input port of the diagnostic switch 115.

When the diagnostic channel 114 is selected, the diagnostic switch 115 is closed so that the diagnostic channel 114 is coupled with the ADC core circuit 130 via the impedance compensator 116. By being coupled in series between the diagnostic channel 114 and the ADC core circuit 130, the impedance compensator 116 helps compensate the voltage degradation (or voltage retardation) of the unselected reception channel 112 that is received in the analog input signal 107. More specifically, the impedance compensator 116 introduces a certain degree of voltage degradation (or voltage retardation) to the diagnostic channel 114, such that the impact of the unselected reception channel 112 may become more significant at the analog input signal 107. Accordingly, the ADC core circuit 130 will generate a digital value that does not correspond to the voltage level of the selected diagnostic channel 114. Based on this deviated digital value, the control circuitry 120 can detect the stuck-closed defect associated with the unselected reception channel 112.

To render stuck-closed defects more detectable by the control circuitry 120, the impedance compensator 116 has a compensatory impedance defined by a function of the fault tolerance range (FTR) of the digital output signal 108. This function ensures the compensatory impedance is large enough that the voltage deviation introduced by the unselected reception channel 112 exceeds the fault tolerance range of the digital output signal 108. More specifically, this function prescribes that the compensatory impedance is equal to or greater than a product of the channel impedance of the unselected reception channel 112 and the fault tolerance range (FTR) of the digital output signal 108. Thus, assuming the channel impedance of the unselected reception channel 112 includes a resistance of $R_{RCPT}$, the compensatory impedance of the diagnostic channel 114 may include a resistance of $R_{DIAG}$ that meets the condition as expressed in Equation 1 below.

$$R_{DIAG} \geq R_{RCPT}(\text{FTR}) \qquad \text{Eq. (1)}$$

In addition to detecting stuck-closed defects, the channel selector circuit 110 includes configurations for detecting stuck-open defects as well. In general, a stuck-open defect can be caused by a switch's (e.g., the reception switch 113) inability to close when the corresponding reception channel 112 is being selected. As a result of a stuck-open defect, the selected reception channel 112 will not be coupled with the ADC core circuit 130 to provide the analog input signal 107. When a stuck-open defect occurs, the analog input signal 107 becomes a floating signal as the input of the ADC core circuit 130 is not coupled with any channel even when one of the reception channels 112 is being selected. The sampling circuit of the ADC core circuit 130 may still sample the floating analog input signal 107 if there are sufficient charges retain at the input node of the sampling circuit.

To prevent the sampling circuit from mistakenly treating the floating analog input signal 107 as a signal delivered by the selected reception channel 112, the channel selector circuit 110 includes a reference channel 117 for periodically resetting the input of the ADC core circuit 130. The reference channel 117 is coupled with a reference switch 118, which is controlled by the control circuitry 120 via the channel selection signal 102. After a sampling cycling of a reception channel 112 or a diagnostic channel 114, the control circuitry 120 directs the reference switch 118 to close for coupling the reference channel 117 with the ADC core circuit 130.

During this time, the ADC core circuit 130 stops the sampling activity and begins the conversion activity. Thus, the reference voltage (REF) carried by the reference channel 117 is not sampled by the ADC core circuit 130. Instead, the reference voltage (REF) is used for resetting the analog input signal 107. Depending on the particular implementation, the reference voltage (REF) may vary. In one implementation, for example, the reference voltage (REF) is supplied by a ground source, such that the reference channel 117 is configured to discharge the analog input signal 107 in between successive sampling cycles. In another implementation, for example, the reference voltage (REF) is at the mid-rail of an internal supply (e.g., VDD), such that the reference channel 117 is configured to pre-charge the analog input signal 107 in between successive sampling cycles. In yet another implementation, for example, the reference voltage (REF) is selected outside of a voltage range of the reception channels 112. By using any one of these reference voltages, the control circuitry 120 is able to detect stuck-open defects associated with a particular reception channel 112 as the sampling monitor signal 106 (which are duplicates of the digital output signals 108) carries a digital output pattern that is keyed to the reference voltage (REF).

Figure 2:
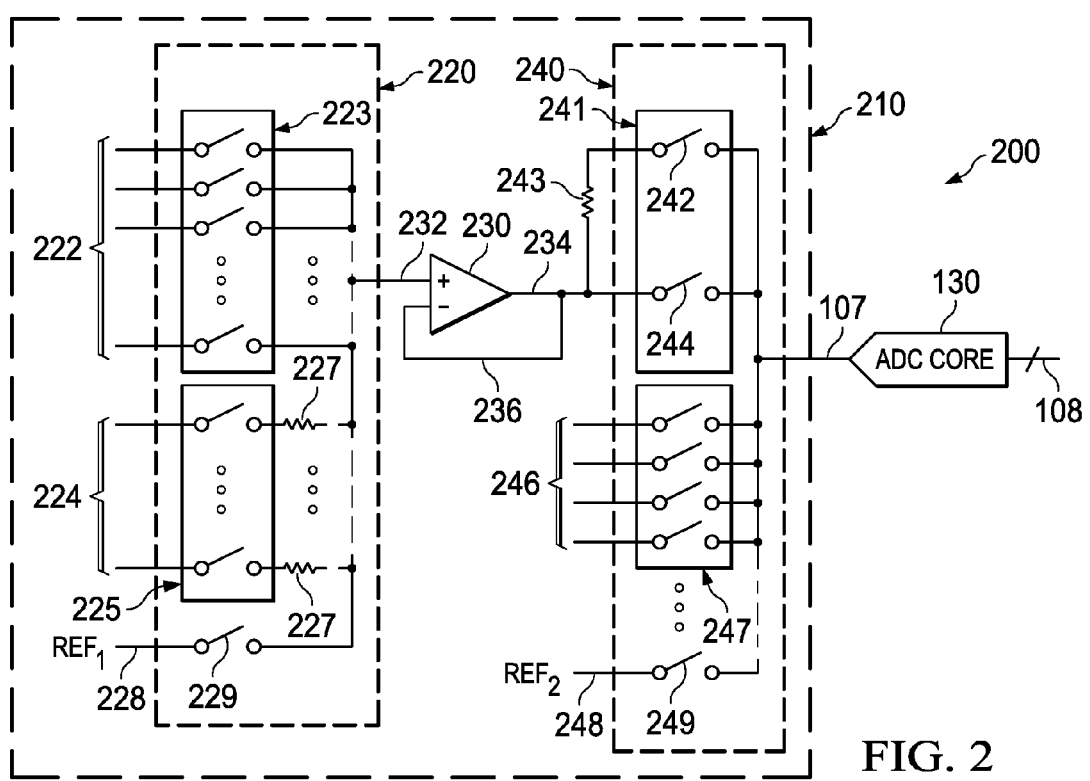
FIG. 2 shows a schematic view of an exemplary ADC circuit according to another aspect of the present disclosure.

FIG. 2 shows a schematic view of an exemplary ADC circuit 200 according to another aspect of the present disclosure. The ADC circuit 200 is formed within an integrated circuit either by itself or along with other systems interacting with the ADC circuit 200. The ADC circuit 200 is a specific implementation of the ADC circuit 100 in that the channel selector circuit 210 is an expanded version of the channel selector 110. The ADC circuit 200 incorporates similar structural and functional features from the ADC circuit 100. For instance, the ADC circuit 200 includes the ADC core circuit 130, which is configured to sample and convert the analog input signal 107 to the digital output signal 108. For better clarity and simplicity, the control circuitry 120 is not shown in FIG. 2, though it is a part of the ADC circuit 200. Like in the ADC circuit 100, the ADC core circuit 130 in the ADC circuit 200 is controlled by the control circuitry 120 in a manner consistent with the description of FIG. 1.

Also like in the ADC circuit 100, the digital output signal 108 in the ADC circuit 200 has a fault tolerance range that represents the precision of the ADC core circuit 130. As described above, the term fault tolerance range can be understood as a range of deviation in the analog input 107 that the ADC core circuit 130 can withstand for generating a consistent digital output signal 108. For example, when the digital output signal 108 has a 4% fault tolerance range, the analog input 107 may deviate 2% above and/or 2% below the nominal voltage level from which the ADC core circuit 130 can generate a consistent digital output signal 108. More specifically, assuming that the ADC core circuit 130 is configured to convert an analog input signal 107 having a voltage level of 5V, a 4% fault tolerance range allows the digital output signal 108 to deliver a consistent 8-bit digital value of 0000 0101 even when the analog input signal 107 deviates between 4.9V (i.e., 2% below 5V) and 5.1V (i.e., 2% above 5V).

The ADC circuit 200 is configured to receive analog inputs from multiple input channels. The channel selector circuit 210 serves as a means for selecting a single channel from these multiple input channels to provide the analog input signal 107 for the ADC core circuit 130. To that end, the channel selector circuit 110 is coupled with the ADC core circuit 130. Though not explicitly shown in FIG. 2, the channel selector circuit 210 is controlled by the control circuitry 120 in a manner consistent with the description of FIG. 1.

The channel selector circuit 210 expands the channel reception capabilities of the channel selector circuit 110. In particular, the channel selector circuit 210 includes two arrays of reception channels. The first array of reception channels (hereinafter "first reception channels") 222 are characterized with high channel impedances whereas the second array of reception channels (hereinafter "second reception channels") 246 are characterized with low channel impedances. Despite their differences in channel impedances, each reception channel (e.g., 222 or 246) is configured to receive an analog signal. At any given of point of time, the channel selector circuit 210 selects one reception channel (e.g., 222 or 246) to be coupled with ADC core circuit 130. The selected reception channel (e.g., 222 or 246) provides the analog input signal 107 to the sampling circuit of the ADC core circuit 130.

The channel selector circuit 210 includes a high impedance multiplexer (i.e., a HZ Mux) 220 and a low impedance multiplexer (i.e., a LZ Mux) 240. The high impedance multiplexer 220 is configured to receive and select a first analog signal among the first reception channels 222. The low impedance multiplexer 240 is configured to receive and select a second analog signal among the second reception channels 246. In general, the high channel impedance of the first reception channels 222 can be contributed by the parasitic effects of bonding pads and/or bonding wires. The second reception channels 246 are coupled with circuitries internal to the integrated circuit in which the ADC circuit 200 is formed. Thus, the second reception channels 256 have a smaller amount of channel impedance than the first reception channels 222.

The channel selector circuit 210 also expands the switching capabilities of the channel selector circuit 110. In particular, the channel selector circuit 210 expands the switch circuit 111 to four groups of switches for selecting among the first reception channels 222, the second reception channels 246, and the diagnostic channels 224. These four groups of switches are controlled by the control circuitry 120 (as shown in FIG. 1) via the channel selection signal 102 (as shown in FIG. 1). In one circuit configuration, the first group of switches 223 and the second group of switches 225 are a part of the high impedance multiplexer 220, whereas the third group of switches 247 and the fourth group of switches 241 are a part of the low impedance multiplexer 240.

In general, the first group of switches (i.e., first switches or first reception switches) 223 and the second group of switches (i.e., second switches or first diagnostic switches) 225 are in complementary states. This means if any one of the switches in either group is closed, all switches in the other group are opened. For instance, if one of the first reception channels 222 is selected, a corresponding first switch 223 is configured to close. And as the complement of the first switches 223, the second switches 225 are configured to open.

Similarly, the third group of switches (i.e., third switches or second reception switches) 247 and the fourth group of switches (i.e., fourth switches or bypass switches) 241 are in complementary states. Closing one of the fourth group of switches 241 indicates that either the first reception channels 222 or the diagnostic channels 224 are being selected. In that case, the second reception channels 246 are bypassed, and the third switches 247 are configured to open. Meanwhile, closing one of the third group of switches 247 indicates that one of the second reception channels 246 is being selected, in which case the fourth switches 241 are configured to open.

The high impedance multiplexer 220 includes a group of first switches 223, each of which is coupled with a particular first reception channel 222. The first switches 223 are configured to selectively couple the first reception channels 222 with the sampling circuit of the ADC core circuit 130. In one implementation, for example, the first switches 223 are configured to link the first reception channels 222 to the sampling circuitry through a buffered channel 234.

The low impedance multiplexer 240 includes a group of third switches 247, each of which is coupled with a particular second reception channel 246. The third switches 247 are configured to selectively link the second reception channels 246 to the sampling circuit of the ADC core circuit 130. In one implementation, for example, the third switches 247 are configured to selectively couple the second reception channels 246 with the sampling circuit when neither the first reception channels 222 nor the diagnostic channels 224 are selected.

The channel selector circuit 210 also includes a buffer 230 coupled between the high impedance multiplexer 220 and the low impedance multiplexer 240. The buffer 230 includes a positive input port being coupled with the first group of switches 223 and the second group of switches 225. The buffer 230 also includes an output port that is coupled with the fourth group of switches 241 via the buffered channel 234. The fourth group of switches 241 is configured to selectively link the buffered channel 234 to the sampling circuit of the ADC core circuit 130 when none of the second reception channels 264 is selected. The fourth group of switches 241 may further includes a fifth switch (i.e., the second diagnostic switch or the DGN switch) 242 and a sixth switch (i.e., the non-diagnostic switch or the NG switch) 244. In general, the fifth switch 242 is closed during a diagnostic sampling cycle, whereas the sixth switch 244 is closed during a regular sampling cycle. Depending on the particular amplifier used for implementing the buffer 230, the buffer 230 may include a buffer feedback signal 236 connecting the buffered channel 234 to a negative input port of the buffer 230.

When one of the first reception channels 222 is selected, the control circuitry 120 (as shown in FIG. 1) is configured to generate the channel selection signal 102 (as shown in FIG. 1) for directing the corresponding first switch 223 to close. As such, the selected first reception channel 222 is coupled with the high impedance output 232. The high impedance output 232 provides an input to the buffer 230, which is a part of the channel selector circuit 210. When enabled or activated, the buffer 230 is configured to amplify the signal delivered by the high impedance output 232. Then, the buffer 230 delivers the amplified signal to the buffered channel 234. The buffered channel 234 is received by the low impedance multiplexer 240.

The low impedance multiplexer 240 includes a non-diagnostic (ND) switch (i.e., the sixth switch) 244 for coupling the buffered channel 234 with the sampling circuit of the ADC core circuit 130. As any one of the first reception channels 222 is selected, the control circuitry 120 (as shown in FIG. 1) is configured to generate the channel selection signal 102 (as shown in FIG. 1) for directing the ND switch 244 to close. Working in conjunction with the first switch 223, the ND switch 244 facilitates the coupling between the selected first reception channel 222 and the sampling circuit of the ADC core circuit 130. Accordingly, the selected first reception channel 222 is configured to deliver the analog input signal 107 to the sampling circuit of the ADC core circuit 130.

When the selected first reception channel 222 becomes unselected, the control circuitry 120 (as shown in FIG. 1) is configured to generate the channel selection signal 102 (as shown in FIG. 1) for directing the corresponding first switch 223 to open. As a result, the unselected first reception channel 222 is decoupled from high impedance output 232, the buffer 230, and the buffered channel 234. As the first reception channel 222 becomes unselected, the control circuitry 120 also direct the ND switch 244 to open, such that the buffered channel 234 is no longer coupled with the ADC core circuit 130 via the ND switch 244.

The high impedance multiplexer 220 also includes a group of diagnostic channels 224, each of which is configured to receive a diagnostic signal for verifying the digital output signal 108 of the ADC core circuit 130. The structural and functional features of the diagnostic channels 224 are substantially similar to those of the diagnostic channel 114 as shown and described in FIG. 1. For instance, the diagnostic channels 224 can be used for detecting inadvertent coupling between an unselected first reception channel (e.g., one of the reception channels 222) and the ADC core circuit 130. The operation of such a detecting scheme is also substantially similar to the one as described in FIG. 1.

The high impedance multiplexer 220 includes a group of second switches 225, each of which is coupled with a particular diagnostic channel 224 and an impedance compensator 227. The second switches 225 are configured to selectively couple the diagnostic channels 224 with the sampling circuit of the ADC core circuit 130. In one implementation, for example, the second switches 225 are configured to link the diagnostic channels 224 to the sampling circuitry through the buffered channel 234.

When one of the diagnostic channels 224 is selected, the control circuitry 120 (as shown in FIG. 1) is configured to generate the channel selection signal 102 (as shown in FIG. 1) for directing the corresponding second switch 225 to close. As such, the selected diagnostic channel 224 is coupled with the high impedance output 232. The high impedance output 232 provides an input to the buffer 230, which is configured to amplify the signal delivered by the high impedance output 232. Then, the buffer 230 delivers the amplified signal to the buffered channel 234. The buffered channel 234 is received by the low impedance multiplexer 240.

The low impedance multiplexer 240 includes a second diagnostic (DGN) switch (i.e., the fifth switch) 242 for coupling the buffered channel 234 with the sampling circuit of the ADC core circuit 130. [LSH] As any one of the diagnostic channels 224 is selected, the control circuitry 120 (as shown in FIG. 1) is configured to generate the channel selection signal 102 (as shown in FIG. 1) for directing the DGN switch 242 to close. Working in conjunction with the second switch (i.e., the first diagnostic switch) 225, the DGN switch (i.e., the second diagnostic switch) 242 facilitates the coupling between the selected diagnostic channel 224 and the sampling circuit of the ADC core circuit 130. Accordingly, the selected diagnostic channel 224 is configured to deliver the analog input signal 107 to the sampling circuit of the ADC core circuit 130.

When the selected diagnostic channel 224 becomes unselected, the control circuitry 120 (as shown in FIG. 1) is configured to generate the channel selection signal 102 (as shown in FIG. 1) for directing the corresponding second switch 225 to open. As a result, the unselected diagnostic channel 224 is decoupled from high impedance output 232, the buffer 230, and the buffered channel 234. As the diagnostic channel 224 becomes unselected, the control circuitry 120 also direct the DGN switch 242 to open, such that the buffered channel 234 is no longer coupled with the ADC core circuit 130 via the DGN switch 242.

Like the channel selector circuit 110, the channel selector circuit 210 includes circuit configurations for detecting stuck-closed defects. In one implementation, for example, the impedance compensator 227 is structured and configured to detect stuck-closed defects of the first group of switches 223 by offsetting the high impedance of the first reception channels 222. To that end, the impedance compensator 227 is coupled with one of the second group of switches 225 (e.g., the diagnostic switch 115). The impedance compensator 227 may be coupled to either side of the corresponding second switch 225. In one implementation, for example, the impedance compensator 227 is coupled in series between the output port of the second switch 225 and the high impedance output 232. In another implementation, for example, the impedance compensator is 227 is coupled in series between the diagnostic channel 224 and the input port of the second switch 225.

When one of the diagnostic channels 224 is selected, the corresponding second switch 225 is closed so that the diagnostic channel 224 is coupled with the ADC core circuit 130 via the impedance compensator 227. By being coupled in series between the diagnostic channel 224 and the ADC core circuit 130, the impedance compensator 227 helps compensate the voltage degradation (or voltage retardation) of the unselected first reception channel 222 at the high impedance output 232. More specifically, the impedance compensator 227 introduces a certain degree of voltage degradation (or voltage retardation) to the diagnostic channel 224, such that the impact of the unselected reception channel 222 may become more significant at the high impedance output 232. Accordingly, the buffer 230 will generate an amplified signal at the buffered channel 234 that deviates from the voltage level of the selected diagnostic channel 224.

In conjunction with the second switches 224, the DGN switch 242 of the fourth group of switches 241 is also configured to close when one of the diagnostic channels 224 is selected. As a result, the distorted version of the selected diagnostic channel 224 is delivered as the analog input signal 107 of the ADC core circuit 130. Based on this distorted input, the ADC core circuit 130 will generate a digital value that does not correspond to the voltage level of the selected diagnostic channel 224. Based on this deviated digital value, the control circuitry 120 can detect the stuck-closed defect associated with the unselected first reception channel 222 and the corresponding first switch 223.

To render stuck-closed defects of the first switches 223 more detectable by the control circuitry 120, the impedance compensator 227 has a compensatory impedance defined by a function of the fault tolerance range (FTR) of the digital output signal 108. This function ensures the compensatory impedance is large enough that the voltage deviation introduced by the unselected first reception channel 222 exceeds the fault tolerance range of the digital output signal 108. More specifically, this function prescribes that the compensatory impedance is equal to or greater than a product of the channel impedance of the unselected first reception channel 222 and the fault tolerance range (FTR) of the digital output signal 108. Thus, assuming the channel impedance of the unselected first reception channel 222 includes a resistance of $R_{RCPT1}$, the impedance compensator 227 may include a resistance of $R_{DIAG1}$ that meets the condition as expressed in Equation 2 below.

$$R_{DIAG1} R_{RCPT1}(FTR) \qquad \text{Eq. (2)}$$

In addition to detecting stuck-closed defects of the first group of switches 223, the channel selector circuit 210 also includes circuit configurations for detecting stuck-closed defects of the third group of switches 247. In one implementation, for example, the low impedance multiplexer 240 includes a supplemental impedance compensator 243 that is structured and configured to detect stuck-closed defects of the third group of switches 247. The supplemental impedance compensator 243 is coupled with the buffered channel 234 and the DGN switch 242. Through the DGN switch 242, the supplemental impedance compensator 243 establishes a signal path between one of the diagnostic channels 224 and the analog input signal 107 of the ADC core circuit 130.

The supplemental impedance compensator 243 is configured to detect stuck-closed defects of the third group of switches 247 by offsetting the impedance of the second reception channels 246. The supplemental impedance compensator 243 may be coupled to either side of the DGN switch 242. In one implementation, for example, the supplemental impedance compensator 243 is coupled in series between the output port of the DGN switch 242 and the analog input signal 107. In another implementation, for example, the supplemental impedance compensator 243 is coupled in series between buffered channel 234 and the input port of the DGN switch 242. When one of the diagnostic channels 224 is selected, the DGN switch 242 is closed so that the diagnostic channel 224 is coupled with the ADC core circuit 130 via the buffer 230 and the supplemental impedance compensator 243.

If one of the third group of switches 247 malfunctions to remain at a stuck-closed position, one of the second reception channels 246 can be coupled with the analog input signal 107 of the ADC core 130 while being unselected. Like the unselected first reception channels 224, the unselected second reception channels 246 can distort the voltage level of the diagnostic channel 224 as amplified and delivered in the buffered channel 234. To ensure the ADC core circuit 130 can properly sample and convert such a distortion, the supplemental impedance compensator 243 serves as a means for promoting the impact of the unselected second reception channels 246.

By being coupled in series between the buffered channel 234 and the ADC core circuit 130, the supplemental impedance compensator 243 helps compensate the voltage degradation (or voltage retardation) of the unselected second reception channel 246 in the analog input signal 107. More specifically, the supplemental impedance compensator 243 introduces a certain degree of voltage degradation (or voltage retardation) to the buffered channel 234, such that the impact of the unselected second reception channel 246 may become more significant in the analog input signal 107. Accordingly, the ADC core circuit 130 will generate a digital value that does not correspond to the voltage level of the selected diagnostic channel 224. This deviated digital value is feedback to the control circuitry 120 via the sampling monitor signal 106 (as shown in FIG. 1). Based on this deviated digital value, the control circuitry 120 can detect the stuck-closed defect associated with the unselected second reception channel 246.

To render stuck-closed defects of the third switches 246 more detectable by the control circuitry 120, the supplemental impedance compensator 243 has a supplemental impedance defined by a function of the fault tolerance range (FTR) of the digital output signal 108. This function ensures the supplemental impedance is large enough that the voltage deviation introduced by the unselected second reception channel 246 exceeds the fault tolerance range of the digital output signal 108. More specifically, this function prescribes that the supplemental impedance is equal to or greater than a product of the channel impedance of the unselected second reception channel 246 and the fault tolerance range (FTR) of the digital output signal 108. Thus, assuming the channel impedance of the unselected second reception channel 246 includes a resistance of $R_{RCPT2}$, the supplemental impedance compensator 243 may include a resistance of $R_{DIAG2}$ that meets the condition as expressed in Equation 3 below.

$$R_{DIAG2} \geq R_{RCPT2}(\text{FTR}) \qquad \text{Eq. (3)}$$

The impedance compensator 227 is structured and routed to offset only the high channel impedance (e.g., $R_{RCPT1}$) of the first reception channels 222, whereas the supplementary impedance compensator 243 is structured and routed to offset only the low channel impedance (e.g., $R_{RCPT2}$) of the second reception channels 246. Because the channel impedance of the first reception channel 224 is typically greater than the channel impedance of the second reception channel 246 (i.e., $R_{RCPT1} \geq R_{RCPT2}$), the impedance compensator 227 generally has a higher impedance than the supplementary impedance compensator 243 (i.e., $R_{DIAG1} \geq R_{DIAG2}$).

By introducing a distortion factor (DF) to either Equation 2 or Equation 3, the distortion caused by the stuck-closed first switch 223 can be readily distinguished from the distortion caused by the stuck-closed third switch 247. In one implementation, for example, the distortion factor (DF) can be used for deriving the impedance ($R_{DIAG1}$) of the impedance compensator 227. By adding the distortion factor (DF), the unselected first reception channels 222 may cause a bigger distortion to the voltage level of the diagnostic channel 224 than the unselected second reception channels 246. More specifically, the impedance ($R_{DIAG1}$) of the impedance compensator 227 can be rewritten according to Equation 4:

$$R_{DIAG1} \geq R_{RCPT1}(\text{FTR}*\text{DF}) \qquad \text{Eq. (4)}$$

Alternatively, the distortion factor (DF) can be used for deriving the impedance ($R_{DIAG2}$) of the supplementary impedance compensator 243. By adding the distortion factor (DF), the unselected second reception channels 246 may cause a bigger distortion to the voltage level of the diagnostic channel 224 than the unselected first reception channels 222. More specifically, the impedance ($R_{DIAG2}$) of the compensatory impedance compensator 243 can be rewritten according to Equation 4:

$$R_{DIAG2} \geq R_{RCPT2}(\text{FTR}*\text{DF}) \qquad \text{Eq. (4)}$$

Like the channel selector 110, the channel selector circuit 210 includes circuit configurations for detecting stuck-open defects of the first group of switches 223 and the third group of switches 247. When a particular one of the first group of switches 223 is stuck open, the corresponding first reception channel 222 will not be coupled with the buffer 230 (and the ADC core circuit 130) even when that channel is selected. Similarly, when a particular one of the third group of switches 247 is stuck open, the corresponding second reception channel 246 will not be coupled with the ADC core circuit 130 even when that channel selected. In either case, the analog input signal 107 becomes a floating signal as the input of the ADC core circuit 130 is not coupled with any channel even when one of the reception channels (e.g., 222 or 246) is being selected. The sampling circuit of the ADC core circuit 130 may still sample the floating analog input signal 107 if there are sufficient charges retain at the input node of the sampling circuit.

To prevent the sampling circuit from mistakenly treating the floating analog input signal 107 as a signal delivered by the selected reception channel (e.g., 222 or 246), the channel selector circuit 210 includes reference channels for periodically resetting the internal input nodes of the ADC circuit 200. For example, the high impedance multiplexer 220 includes a first reference channel 228 for periodically resetting the input of the buffer 230. The first reference channel 228 is coupled with a first reference switch 229, which is controlled by the control circuitry 120 (as shown in FIG. 1) via the channel selection signal 102 (as shown in FIG. 1). After a sampling cycle of the first reception channel 222 or the diagnostic channel 224, the control circuitry 120 directs the first reference switch 229 to close for coupling the first reference channel 228 with the buffer 230.

During this time, the ADC core circuit 130 stops the sampling activity and begins the conversion activity. Thus, the first reference voltage ($\text{REF}_1$) carried by the first reference channel 228 is not sampled by the ADC core circuit 130. Instead, the first reference voltage ($\text{REF}_1$) is used for resetting the high impedance output 232 as well as the input of the buffer 230. Via the buffer feedback signal 236, the buffer 230 can be reset and calibrated according to the first reference voltage (REF1). Depending on the particular implementation, the first reference voltage ($\text{REF}_1$) may vary.

In one implementation, for example, the first reference voltage ($REF_1$) is supplied by a ground source, such that the first reference channel 228 is configured to discharge the input of the buffer 230 (e.g., the high impedance output 232) in between successive sampling cycles. In another implementation, for example, the first reference voltage ($REF_1$) is at the mid-rail of an internal supply (e.g., VDD), such that the first reference channel 228 is configured to pre-charge the input of the buffer 230 in between successive sampling cycles. In yet another implementation, for example, the first reference voltage ($REF_1$) is selected outside of a voltage range of the first reception channels 222. By using any one of these first reference voltages, the control circuitry 120 is able to detect stuck-open defects associated with a particular first reception channel 222 as the sampling monitor signal 106 carries a digital output pattern that is keyed to the first reference voltage ($REF_1$).

In addition to the first reference channel 228, the channel selector circuit 210 also includes a second reference channel 248 for periodically resetting the ADC core circuit 130. More particularly, the second reference channel 248 can be incorporated to the low impedance multiplexer 240.

The second reference channel 248 is coupled with a second reference switch 249, which is controlled by the control circuitry 120 (as shown in FIG. 1) via the channel selection signal 102 (as shown in FIG. 1). After a sampling cycling of the first reception channel 222, the second reception channel 246, or the diagnostic channel 224, the control circuitry 120 directs the second reference switch 249 to close for coupling the second reference channel 248 with the ADC core circuit 130.

During this time, the ADC core circuit 130 stops the sampling activity and begins the conversion activity. Thus, the second reference voltage ($REF_2$) carried by the second reference channel 248 is not sampled by the ADC core circuit 130. Instead, the second reference voltage ($REF_2$) is used for resetting the analog input signal 107 and the ADC core circuit 130. Depending on the particular implementation, the second reference voltage ($REF_2$) may vary. In one implementation, for example, the second reference voltage ($REF_2$) is supplied by a ground source, such that the second reference channel 248 is configured to discharge the analog input signal 107 in between successive sampling cycles. In another implementation, for example, the second reference voltage ($REF_2$) is at the mid-rail of an internal supply (e.g., VDD), such that the second reference channel 248 is configured to pre-charge the analog input signal 107 in between successive sampling cycles. In yet another implementation, for example, the second reference voltage ($REF_2$) is selected outside of a voltage range of the second reception channels 246. By using any one of these reference voltages, the control circuitry 120 is able to detect stuck-open defects associated with a particular first reception channel 222, the second reception channel 246, and even the diagnostic channel 224 as the sampling monitor signal 106 (which are duplicates of the digital output signals 108) carries a digital output pattern that is keyed to the second reference voltage ($REF_2$).

Figure 3:
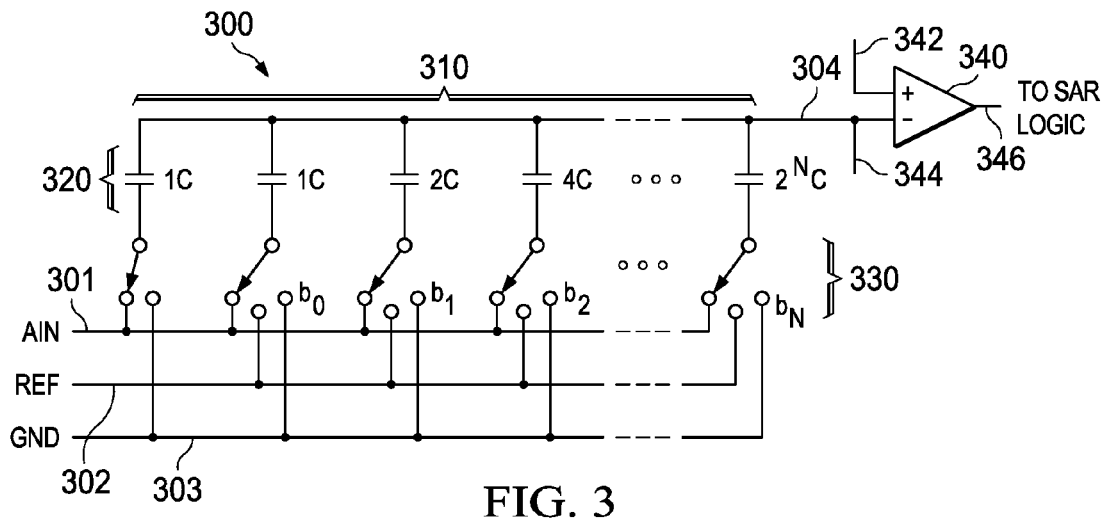
FIG. 3 shows a schematic view of an exemplary sampling circuit according to an aspect of the present disclosure.

FIG. 3 shows a schematic view of an exemplary sampling circuit 300 according to an aspect of the present disclosure. The sampling circuit 300 provides a particular implementation of the sampling circuit as described in association with the ADC core circuit 130 of FIGS. 1 and 2. The sampling circuit 300 includes an analog input port (AIN) 301, a reference port (REF) 302, and a ground port (GND) 303. The analog input port 301 receives the analog input signal 107 as described in FIGS. 1 and 2. The reference port 302 receives the reference signal 117 as described in FIG. 1 or the second reference signal 248 as described in FIG. 2. The ground port 303 receives a ground source provided to the ADC circuit (e.g., the ADC circuit 100 or the ADC circuit 200).

The sampling circuit 300 includes a circuit configuration for sampling an analog signal to a sampled output 346 having multiple digits (e.g., N+1 digits). In one implementation, the sampling circuit 300 includes N+1 data paths 310. Each data path 310 represents a single bit (e.g., bits $b_0$, $b_1$, $b_2$ ... $b_N$) of the sampled output 346. Each data path includes a sampling capacitor 320 and a sampling switch 330. The sampling capacitor 320 has a capacitance defined by its relative bit position. For instance, the sampling capacitor 320 of bit $b_0$ includes a capacitance of $2^0$ C., whereas the sampling capacitor 320 of bit $b_N$ includes a capacitance of $2^N$C where C is a nominal capacitance for the sampling circuit 300.

At any point of time, the sampling switch 330 of each sampling path 310 is configured to select one of the three ports (i.e., AIN 301, REF 302, or GND 303) for coupling with the corresponding sampling capacitor 320. During a sampling period, the control circuitry 120 (as shown in FIG. 1) directs the sampling switch 330 to select the AIN port 301 via the sampling control signal 104 (as shown in FIG. 1). When the sampling switch 330 is closed with the AIN port 301, the sampling circuit 300 is coupled with the analog input signal 107 as described in FIGS. 1 and 2. To that effect, the analog input signal 107 is used for charging the sampling capacitors 320.

During a reset period, which is typically scheduled before the sampling period, the control circuitry 120 (as shown in FIG. 1) directs the sampling switch 330 to select either the REF port 302 or the GND port 303 via the sampling control signal 104 (as shown in FIG. 1). When the sampling switch is closed with the REF port 302, the sampling circuit 300 is coupled with the reference channel 117 (as shown in FIG. 1) or the second reference channel 248 (as shown in FIG. 2). To that effect, the reference channel is used for pre-charging the sampling capacitors 320 to a predetermined reference voltage (e.g., REF or $REF_2$) during the reset period. Alternatively, when the sampling switch is closed with the GND port 303, the sampling circuit 300 is coupled with a ground source, such that the sampling capacitors 320 are discharged to ground during the reset period.

The sampling circuit 300 also includes a sampling amplifier 340, which includes a positive input port 342 and a negative input port 344. The positive input port 342 is connected to a reference input. The negative input port 344 is connected to the sampling paths 310. Based on the inputs received at the positive and negative input ports 342 and 344, the sampling amplifier 340 generates the sampled output 346. According to an aspect of the present disclosure, the sampled output 346 is forwarded to a successive approximation register (SAR) logic.

Figure 4:
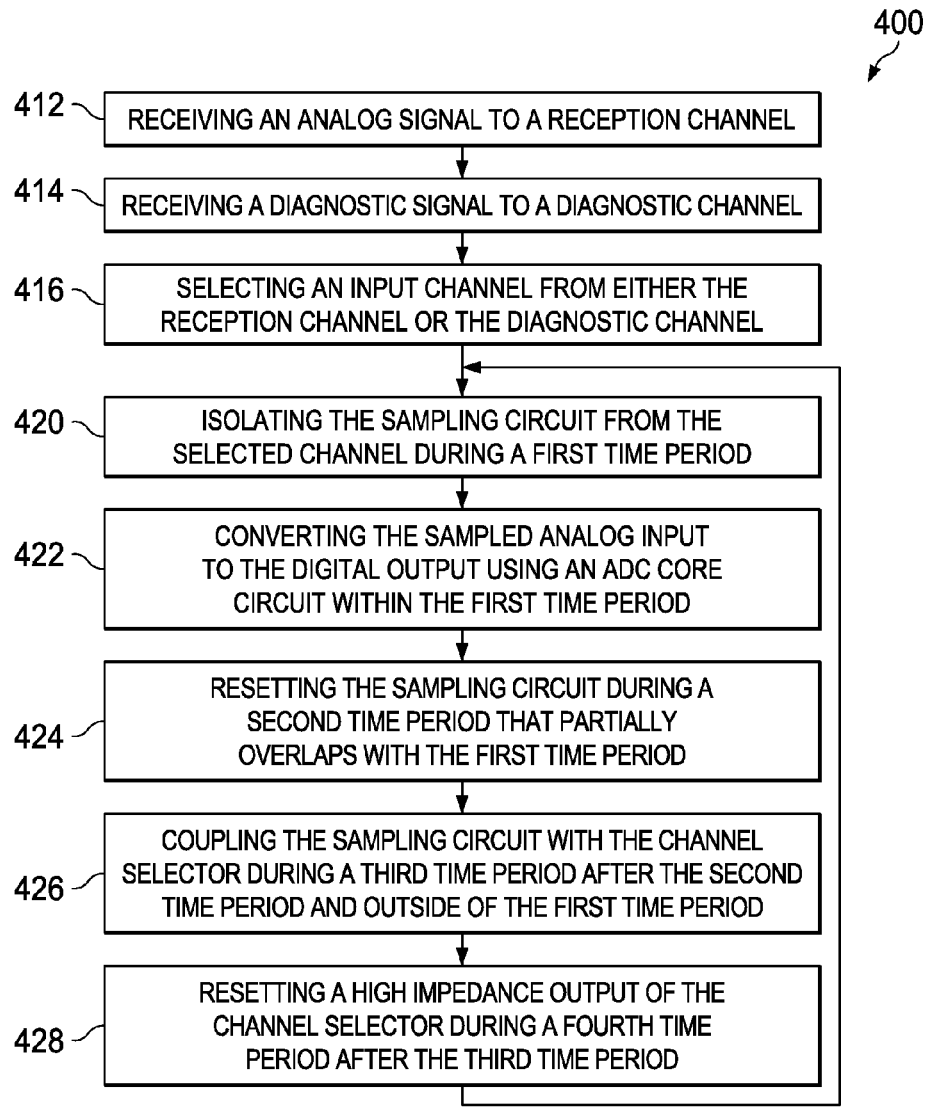
FIG. 4 is a flow chart illustrating an exemplary method for verifying digital outputs of an ADC according to an aspect of the present disclosure.

FIG. 4 is a flow chart illustrating an exemplary method 400 for verifying digital outputs of an ADC according to an aspect of the present disclosure. The method 400 can be performed by the ADC circuit 100, the ADC circuit 200, and/or the sampling circuit 300 as shown and described in FIGS. 1-3. The method 400 can also be performed by circuits that incorporate the structural features of the ADC circuit 100, the ADC circuit 200, and/or the sampling circuit 300. Steps 412-428 of the method 400 can be performed sequentially or in other alternative orders that are consistent with the present disclosure.

In one implementation, for instance, the control circuitry 120 (as shown in FIG. 1) is configured to effectuate the performance of steps 412-428. More specifically, the control circuitry 120 includes a processing circuitry and a non-transitory memory storage device coupled to the processing circuitry. The non-transitory memory storage device stores a set of instructions, which upon implemented by the processing circuitry, cause the processing circuitry to generate a set of channel selection signal 102 and sampling control signal 104 (as shown and described in FIGS. 1-2). In turn, the channel selection signal 102 and the sampling control signal 104 direct various circuits of the ADC circuits 100 and/or 200 to perform steps 412-428 of the method 400.

Step 412 involves receiving an analog signal to a reception channel. Referring to FIG. 1, the reception channels 112 are adapted to performed step 412. And referring to FIG. 2, the first reception channels 222 and the second reception channels 246 are adapted to perform step 412 as well.

Step 414 involves receiving a diagnostic signal to a diagnostic channel. Referring to FIG. 1, the diagnostic channel 114 is adapted to performed step 414. And referring to FIG. 2, the diagnostic channels 224 are adapted to perform step 414 as well.

Step 416 involves selecting an input channel from either the reception channel or the diagnostic channel. Referring to FIG. 1, the switch circuit 111 is adapted to performed step 416. In particular, either the reception switches 113 or the diagnostic switch 115 is configured to close during step 416. As a result, the analog input channel 107 is selectively coupled with either the reception channels 112 or the diagnostic channel 114.

Referring to FIG. 2, the first, second, third, and fourth switch groups (i.e., 223, 225, 241, and 247) are collectively adapted to perform step 416. When the first reception channels 222 are selected, the first switches 223 and the fourth switches 241 are configured to close whereas the second switches 225 and the third switches 247 are configured to open. When the second reception channels 246 are selected, the first switches 223, second switches 225, and the fourth switches 241 are configured to open whereas the third switches 247 are configured to close. When the diagnostic channels 224 are selected, the second switches 225 and the fourth switches 241 are configured to close whereas the first switches 223 and the third switches 247 are configured to open. Accordingly, the analog input channel 107 is selectively coupled with one of the first reception channels 222, the second reception channels 246, or the diagnostic channels 224.

Step 420 involves isolating the sampling circuit from the selected channel during a first time period. Referring to FIG. 3, the sampling switches 330 are adapted to perform step 420. In particular, the sampling switches 330 are configured to decouple the sampling capacitors 320 from the AIN port 301. As a result, the sampling circuit 300 is isolated from the selected channel even when the selected channel is coupled to the analog input signal 107.

Step 422 involves converting the sampled analog input to the digital output using an ADC core circuit within the first time period. In general, the analog input is sampled in step 426 (see infra). On the one hand, if there is no previously sampled analog input, the method 400 will skip step 422 to proceed to step 424. On the other hand, if step 426 has been performed at least once prior to step 422, the method 400 will include step 422. In the event that step 422 is performed, the sampling circuit 300 and the control circuitry 120 are adapted to perform this step. More specifically, referring to FIG. 3, the sampling switches 330 are configured to couple the sampling capacitors 320 to either one of the REF port 302 or the GND port 303 within the first time period. Such couplings allow the sampling amplifier 340 to isolate and detect charges previously stored in the sampling capacitor 320 of each sampling path 310. As a result, the sampling amplifier 340 can determine a discrete digital value associated with each sampling path 310, and from there, the sampling amplifier 340 generates a digit worth of sampled output 346. Collectively, a series of sampled outputs 346 are sent to the SAR logic, which is configured to concatenate the series of sampled outputs 346 to form the digital output (e.g., the digital output 108)

Upon converting the sampled analog input to the digital output, step 422 may further involving detecting whether the sampled channel has a switch defect, which includes the stuck-open and stuck-closed defects as described in association with FIGS. 1-3. The control circuitry 120 is adapted to perform this step by receiving the sampling monitor signal 106. More specifically, the control circuitry 120 examines the digital output carried by the sampling monitor signal 106 to determine whether the digital output constitutes a valid conversion. In the event that the control circuitry 120 detects a stuck-open defect or a stuck-closed defect in association with the digital output, the control circuitry 120 may declare the conversion invalid, discard the digital output, and generate a warning signal to a higher level system (e.g., a system that incorporated the ADC circuit 100 or 200).

To detect a stuck-open defect, the control circuitry 120 determines whether the digital output of a sampled channel (e.g., 222, 224, or 246) matches with the expected digital value of a reference voltage (e.g., $REF_1$ or $REF_2$) provided by a reference channel (e.g., 228 or 248). In one implementation, the reference voltage is within the input range of the sampled channel. The control circuitry 120 determines the presence of a stuck-open defect by detecting a data pattern of the sampled channel over two or more successive sampling cycles. For instance, if the input range of a sampled channel is 1V to 5V, the digital outputs of that sampled channel can be 2.5V at a first sampling cycle, 1V at a second sampling cycle, and 2.5V at a third sampling cycle. And if the reference voltage for resetting the sampling circuit (e.g., at analog input signal 107) or for resetting the high impedance output (e.g., 232) has an alternating pattern switching between 2.5V and 1V, the control circuitry 120 will detect a stuck-open defect of the sampled channel after the third sampling cycle.

In another implementation, the reference voltage is outside the input range of the sampled channel. The control circuitry 120 determines the presence of a stuck-open defect by matching the digital output of the sampled channel to the expected digital value of the reference voltage. For instance, if the input range of a sampled channel is 1V to 5V, the reference voltage can be set at 6V. In that case, the control circuitry 120 is able to detect a stuck-open defect whenever the digital output of the sampled channel corresponds to a 6V value, which may only take one sampling cycle.

To detect a stuck-closed defect, the control circuitry 120 searches for a faulty conversion of a diagnostic channel (e.g., 224). During a diagnostic sampling cycle, a diagnostic channel is selected and sampled. If any of the reception channels (e.g., 222 or 246) are stuck-closed, the digital output of the sampled diagnostic channel will deviate from the expected value of the voltage carried by the diagnostic channel (i.e., a faulty conversion). In one implementation, the control circuitry 120 may declare a stuck-closed defect upon finding a faulty conversion after one diagnostic sampling cycle. In another implementation, the control circuitry 120 may declare a stuck-closed defect upon consistently finding a series of faulty conversions over two or more diagnostic sampling cycles.

Step 424 involves resetting the sampling circuit during a second time period that partially overlaps with the first time period. In a specific implementation, resetting the sampling circuit may further include periodically charging an input capacitor (e.g., the sampling capacitor 320) of the sampling circuit to a reference voltage during the second time periods in succession. This reference voltage can be set as 0V or to the second reference voltage $REF_2$. Alternatively, this reference voltage can alternate between 0V and a non-zero voltage during the successive second time periods.

Referring to FIG. 1 in conjunction with FIG. 3, the reference channel 117 and the reference switch 118 cooperate with the sampling switch 330 to perform step 424. The reference switch 118 is configured to close during the second time period, such that the reference channel 117 is coupled to the analog input signal 107 of the ADC core circuit 130. In one implementation, the sampling switches 330 are configured to select the REF port 302 for resetting the sampling capacitors 320 to the reference voltage (REF). In another implementation, the sampling switches 330 are configured to select the GND port 302 for resetting the sampling capacitors 320 to a ground voltage.

Also referring to FIG. 2 in conjunction with FIG. 3, the second reference channel 248 and the second reference switch 249 cooperate with the sampling switch 330 to perform step 424. The second reference switch 249 is configured to close during the second time period, such that the second reference channel 248 is coupled to the analog input signal 107 of the ADC core circuit 130. In one implementation, the sampling switches 330 are configured to select the REF port 302 for resetting the sampling capacitors 320 to the second reference voltage ($REF_2$). In another implementation, the sampling switches 330 are configured to select the GND port 302 for resetting the sampling capacitors 320 to a ground voltage.

The reference voltage (e.g., REF and $REF_2$) received by the sampling circuit can be set within the voltage range of the selected channels. In order to provide a more robust sampling reset, the reference voltage (e.g., REF and $REF_2$) can also be set at a value that is beyond the voltage range of the selected channels. For instance, if the previously selected channel has a voltage range of 1V to 5V, the reference voltage (e.g., REF and $REF_2$) can be set at 0V or 6V. Such a reference voltage (e.g., REF and $REF_2$) setting allows the control circuitry 120 to detect a stuck-open defect within one sampling cycle.

Step 426 involves coupling the sampling circuit with the channel selector during a third time period after the second time period and outside of the first time period. Referring to FIG. 3, the sampling switches 330 are adapted to perform step 426. In particular, the sampling switches 330 are configured to couple the sampling capacitors 320 to the AIN port 301. The performance of step 426 allows the sampling circuit 300 to sample the selected channel.

Step 428 involves resetting a high impedance output of the channel selector during a fourth time period after the third time period. Referring to FIG. 2, the first reference channel 228 and the first reference switch 229 are adapted to perform step 428. The first reference switch 229 is configured to close during the fourth time period, such that the first reference channel 228 is coupled to the high impedance output 232. The first reference voltage ($REF_1$) resets the high impedance output 232 after the first reception channels 222 or the diagnostic channels 224 are sampled by the sampling circuit 300 of the ADC core circuit 120. The resetting of the high impedance output 232 prevents the buffer 230 from amplifying a floating node caused by a stuck-open defect of a selected switch (e.g., 223 or 225). As a result, the ADC core circuit 130 can generate a digital value that tracks the first reference voltage ($REF_1$) when any one of the first group of switches 223 or the second group of switches 225 is stuck open.

The first reference voltage $REF_1$ can be set within the voltage range of the selected channels (e.g., 222 and 224). In order to provide a more robust high impedance reset, the first reference voltage $REF_1$ can also be set at a value that is beyond the voltage range of the selected channels. For instance, if the selected channel has a voltage range of 1V to 5V, the first reference voltage $REF_1$ can be set at 0V or 6V. Such a reference voltage setting allows the control circuitry 120 to detect a stuck-open defect within one sampling cycle.

After performing step 428, the method 400 may return to step 420 if there are additional selected channels. Depending on the particularly implementation, the performance of steps 420 to 428 can be concurrent with the performance of steps 412 to 416. Thus, while any one of steps 420 to 428 is being performed, steps 412 to 416 may be performed simultaneously in a recursive or non-recursive manner.

Figure 5A:
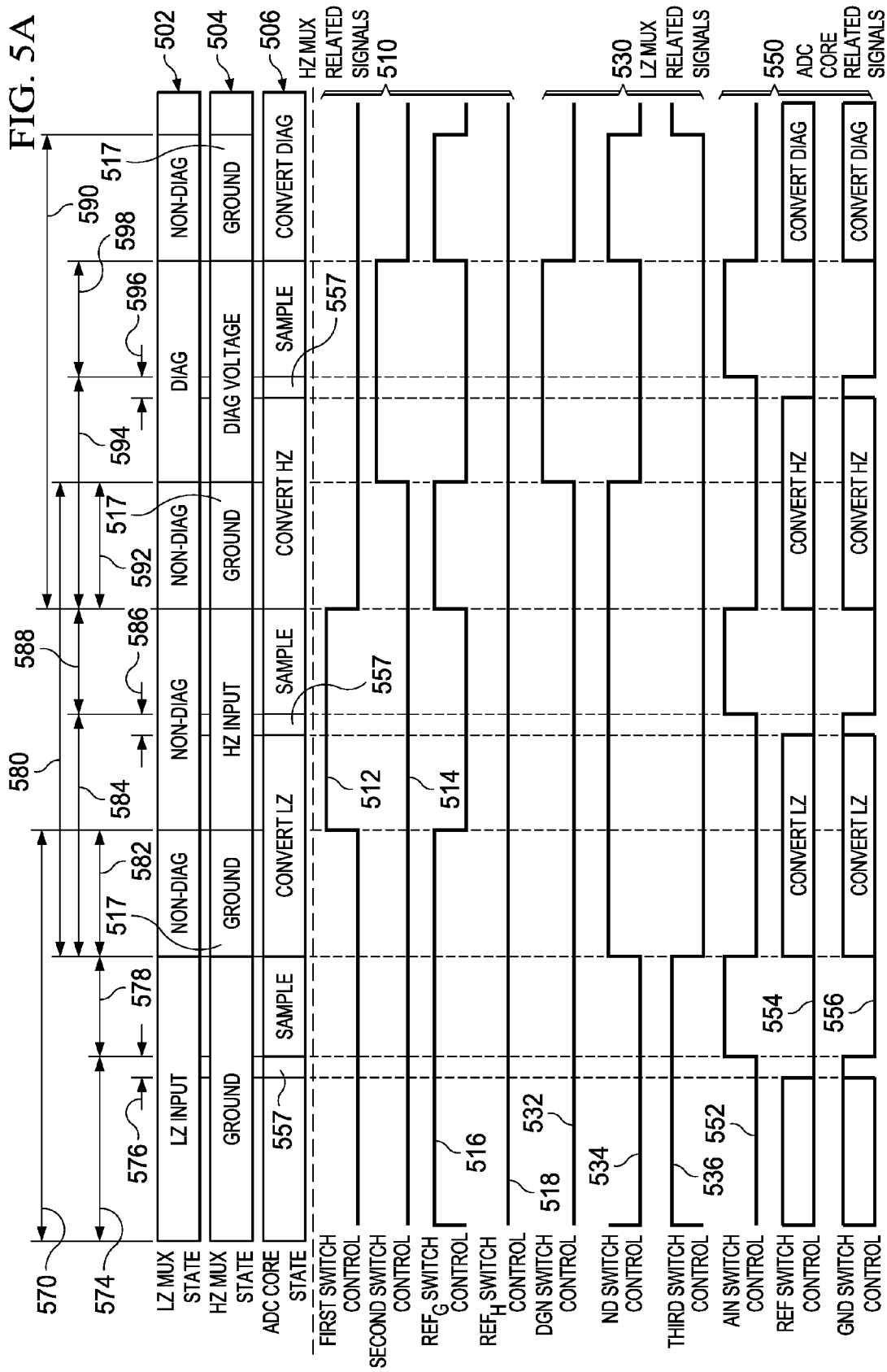
FIG. 5A is a timing diagram illustrating the sampling cycles of an exemplary ADC according to an aspect of the present disclosure.

FIG. 5A is a timing diagram illustrating the sampling cycles of the exemplary ADC circuit 200 according to an aspect of the present disclosure. The top part of this timing diagram includes the operational states of various circuitries inside of the exemplary ADC circuit 200. More specifically, state 502 represents the operational state of the low impedance multiplexer (hereinafter "LZ Mux") 240, state 504 represents the operational state of the high impedance multiplexer (hereinafter "HZ Mux") 220, and state 506 represents the operational state of the ADC core circuit 130.

The lower part of this timing diagram includes the control signals generated by the control circuitry 120 for effectuating the transitions within these operational states. The HZ Mux related signals 510 and the LZ Mux related signals 430 are included in the channel selection signal 102 as shown and described in FIGS. 1-2. More specifically, the control circuitry 120 generates the HZ Mux related signals 510 and the LZ Mux related signals 530 for controlling the switching activities within the HZ Mux 220 and the LZ Mux 240 respectively.

The HZ Mux related signals 510 include a first switch control signal 512, a second switch control signal 514, a $REF_G$ switch control signal 516, and a $REF_H$ switch control signal 518. The first switch control signal 512 controls the switching activities of the first group of switches (i.e., first switches) 223. When the first switch control signal 512 has a high value, one of the first switches 223 is configured to close, thereby indicating that one of the first reception channels 222 is selected for sampling. In contrary, when the first switch control signal 512 has a low value, all of the first switches 223 are configured to open, thereby indicating that none of the first reception channels 222 is selected sampling.

The second switch control signal 514 controls the switching activities of the second group of switches (i.e., the second switches) 225. When the second switch control signal 514 has a high value, one of the second switches 225 is configured to close, thereby indicating that one of the diagnostic channels 224 is selected for sampling. In contrary, when the second switch control signal 514 has a low value, all of the second switches 225 are configured to open, thereby indicating that none of the diagnostic channels 224 is selected for sampling.

The REF$_G$ switch control signal 516 controls the switching activities of the first reference switch 229. When the REF$_G$ switch control signal 516 has a high value, the first reference switch 229 is configured to close for connecting with a ground source. As such, the first reference channel 228 is selected for resetting the high impedance output 232, and the reference voltage is set at a zero value (e.g., a ground voltage). When the REF$_G$ switch control signal 516 has a low value, one of two scenarios occurs. In a first scenario, the first reference channel 228 is not selected for resetting the high impedance output 232. In second scenario, the first reference channel 228 is selected for resetting the high impedance output 232 but the reference voltage is set at a non-zero value.

The REF$_H$ switch control signal 518 also controls the switching activities of the first reference switch 229. When the REF$_H$ switch control signal 518 has a high value, the first reference switch 229 is configured to close for connecting with a non-zero voltage source. As such, the first reference channel 228 is selected for resetting the high impedance output 232, and the reference voltage is set at a non-zero value. When the REF$_H$ switch control signal 518 has a low value, one of two scenarios occurs. In a first scenario, the first reference channel 228 is not selected for resetting the high impedance output 232. In a second scenario, the first reference channel 228 is selected for resetting the high impedance output 232 but the reference voltage is set at a zero value.

The LZ Mux related signals 530 include a DGN switch control signal 532, a ND switch control signal 534, and a third switch control signal 536. The DGN switch control signal 532 controls the switching activities of the DGN switch 242. When the DGN switch control signal 532 has a high value, the DGN switch 242 is configured to close, thereby indicating that one of the diagnostic channels 224 is selected for sampling. In contrary, when the DGN switch control signal 532 has a low value, the DGN switch 242 is configured to open, thereby indicating that none of the diagnostic channels 224 is selected for sampling.

The ND switch control signal 534 controls the switching activities of the ND switch 244. When the ND switch control signal 534 has a high value, the ND switch 244 is configured to close, thereby indicating that one of the first reception channels 222 is selected for sampling. In contrary, when the ND switch control signal 534 has a low value, the ND switch 244 is configured to open, thereby indicating that none of the first reception channels 222 is selected for sampling.

The third switch control signal 536 controls the switching activities of the third group of switches (i.e., the third switches) 247. When the third switch control signal 536 has a high value, one of the third switches 247 is configured to close, thereby indicating that one of the second reception channels 246 is selected for sampling. In contrary, when the third switch control signal 536 has a low value, all of the third switches 246 are configured to open, thereby indicating that none of the second reception channels 246 is selected for sampling.

The ADC core related signals 550 are included in the sampling control signal 104 as shown and described in FIGS. 1-2. More specifically, the control circuitry 120 generates the ADC core related signals 550 for controlling the switching activities within the sampling circuit 300 of the ADC core circuit 130. The ADC core related signals 550 include an AIN switch control signal 552, a REF switch control signal 554, and a GND switch control signal 556.

The AIN switch control signal 552 controls the switching activities of the sampling switches 330 in the sampling circuit 300. When the AIN switch control signal 552 switches from a low value to a high value, it directs each of the sampling switches 330 to connect the respective sampling capacitor 320 to the analog input port 301. As a result, the sampling circuit 300 is coupled with a selected channel (e.g., 222, 224, or 246) via one or more multiplexers (e.g., 240 and/or 220), and the sampling circuit 300 begins sampling the selecting channel. When the AIN switch control signal 552 switches from a high value to a low value, it directs each of the sampling switches 330 to disconnect the respective sampling capacitor 320 from the analog input port 301. As a result, the sampling circuit 300 is decoupled from a selected channel (e.g., 222, 224, or 246), and the sampling circuit 300 terminates the sampling of the selecting channel.

The REF switch control signal 554 also controls the switching activities of the sampling switches 330 in the sampling circuit 300. When the REF switch control signal 554 switches from a low value to a high value, it directs each of the sampling switches 330 to connect the respective sampling capacitor 320 to the reference port 302. As a result, the sampling circuit 300 is coupled with the second reference channel 248 via the LZ Mux 240, and the sampling circuit 300 begins the reset process by pre-charging the sampling capacitors 320 using the second reference voltage REF$_2$. When the REF switch control signal 554 switches from a high value to a low value, it directs each of the sampling switches 330 to disconnect the respective sampling capacitor 320 from the reference port 302. As a result, the sampling circuit 300 is decoupled from the second reference channel 248, and the sampling circuit 300 terminates the resetting of the sampling capacitors 320.

The GND switch control signal 556 similarly controls the switching activities of the sampling switches 330 in the sampling circuit 300. When the GND switch control signal 556 switches from a low value to a high value, it directs each of the sampling switches 330 to connect the respective sampling capacitor 320 to the ground port 303. As a result, the sampling circuit 300 is coupled with a ground source, and the sampling circuit 300 begins the reset process by discharging the sampling capacitors 320 to the ground source. When the GND switch control signal 556 switches from a high value to a low value, it directs each of the sampling switches 330 to disconnect the respective sampling capacitor 320 from the ground port 303. As a result, the sampling circuit 300 is decoupled from the ground source, and the sampling circuit 300 terminates the resetting of the sampling capacitors 320.

During a first sampling cycle 570, the ADC circuit 200 is configured to sample a low impedance analog channel. For instance, one of the second reception channels 246 is selected for the sampling circuit 300. During a first time period 574 within the first sampling cycle 570, the LZ Mux 240 is turned on for receiving a LZ analog input signal, whereas the HZ Mux 220 is coupled to ground. To that effect, the third switch control signal 536 and the REF$_G$ switch control signal 516 each has a high value whereas the first switch control signal 512, the second switch control signal 514, the DGN switch control signal 532, and the ND switch control signal 534 each has a low value.

During the first time period 574, the sampling circuit 300 is isolated from the selected channel (e.g., the second reception channel 246) for performing step 420 of the method 400. To that effect, the AIN switch control signal 552 stays low during the first time period 570 such that the sampling circuit 300 is decoupled from the channel selector circuit 210. Because there is no previously sampled channel at this stage, the sampling circuit 300 does not perform any conversion (i.e., step 422 of the method 400) during the first time period 570.

A second time period 576 of the first sampling cycle 570 begins towards the tail end of the first time period 574. And the second time period 576 partially overlaps with the first time period 574. During the second time period 576, the ADC core circuit 130 enters a ground reset state 557 for performing step 424 of the method 400. The ground reset state 557 facilitates the detection of stuck-open defects as described above. To actuate the ground reset state 557, the AIN switch control signal 552 remains low while the GND switch control signal 556 turns high. As a result, all the sampling capacitors 320 are discharged to ground prior to sampling.

A third time period 578 of the first sampling cycle 570 begins after the second time period 576. The third time period 578 is outside of the first time period 574. During the third time period 578, the ADC core circuit 130 enters a sampling state for performing step 426 of the method 400. In the sampling state, the sampling circuit 300 is configured to sample the selected channel (e.g., the second reception channel 246). To actuate the sampling state, the AIN switch control signal 552 turns high while the GND switch control signal 556 turns low. As a result, the sampling capacitors 320 are coupled with the selected channel via the analog input port 301 and the LZ Mux 240.

A fourth timing period 582 of the first sampling cycle 570 begins after the third time period 578. The fourth timing period 582 partially overlaps with a first time period 584 of a second sampling cycle 580. During the fourth timing period 582 of the first sampling cycle 570, the HZ Mux 220 enters a ground reset state 517 for performing step 428 of the method 400. Within the ground reset state 517, the $REF_G$ switch control signal 516 has a high value. To that effect, the first reference switch 229 is closed to couple the high impedance output 232 with a ground source. Discharging the high impedance output 232 after each sampling cycle allows the control circuitry 120 to detect stuck-open defects of the HZ Mux 220.

The second sampling cycle 580 begins after the third time period 578 of the first sampling cycle 570. Thus, the second sampling cycle 580 partially overlaps with the first sampling cycle 570. During the second sampling cycle 580, the ADC circuit 200 is configured to sample a high impedance analog channel. For instance, one of the first reception channels 222 is selected for the sampling circuit 300. During a first time period 584 within the second sampling cycle 580, the HZ Mux 220 is turned on for receiving a HZ analog input signal after the HZ Mux 220 exits the ground reset state 517. Meanwhile, the LZ Mux 240 is turned on for receiving the non-diagnostic channel (e.g., the first reception channel 222) from the HZ Mux 220. To that effect, the first switch control signal 512 and the ND switch control signal 534 each has a high value whereas the second switch control signal 514, the third switch control signal 516, and the DGN switch control signal 532 each has a low value.

During the first time period 584, the sampling circuit 300 has substantially the same switching activities as in the first time period 574 of the first sampling cycle 570. In particular, the sampling circuit 300 is isolated from the selected channel (e.g., the first reception channel 222) for performing step 420 of the method 400. Unlike the first sampling cycle 570 however, there is a previously sampled channel (e.g., the second reception channel 246) at the outset of the second sampling cycle 580. Thus, the ADC core circuit 130 enters a LZ Conversion state to perform step 422 of the method 400. In particular, the sampling circuit 300 cooperates with the control circuitry 120 to convert the previously sampled channel while being isolated from the selected channel. To that effect, the REF switch control signal 554 and the GND switch control signal 556 are toggled during the first time period 584. With the converted output (which is carried by the sampling monitor signal 106), the control circuitry 120 can detect stuck-open defects as described above.

A second time period 586 of the second sampling cycle 580 begins towards the tail end of the first time period 584. And the second time period 586 partially overlaps with the first time period 584. During the second time period 586, the ADC core circuit 130 enters a ground reset state 557 for performing step 424 of the method 400. The ground reset state 557 facilitates the detection of stuck-open defects as described above. To actuate the ground reset state 557, the AIN switch control signal 552 remains low while the GND switch control signal 556 turns high. As a result, all the sampling capacitors 320 are discharged to ground prior to sampling.

A third time period 588 of the second sampling cycle 580 begins after the second time period 586. The third time period 588 is outside of the first time period 584. During the third time period 588, the ADC core circuit 130 enters a sampling state for performing step 426 of the method 400. In the sampling state, the sampling circuit 300 is configured to sample the selected channel (e.g., the first reception channel 222). To actuate the sampling state, the AIN switch control signal 552 turns high while the GND switch control signal 556 turns low. As a result, the sampling capacitors 320 are coupled with the selected channel via the analog input port 301, the LZ Mux 240, and the HZ Mux 220.

A fourth timing period 592 of the second sampling cycle 580 begins after the third time period 588. The fourth timing period 592 partially overlaps with a first time period 594 of a third sampling cycle 590. During the fourth timing period 592 of the second sampling cycle 580, the HZ Mux 220 enters a ground reset state 517 for performing step 428 of the method 400. Within the ground reset state 517, the $REF_G$ switch control signal 516 has a high value. To that effect, the first reference switch 229 is closed to couple the high impedance output 232 with a ground source. Discharging the high impedance output 232 after each sampling cycle allows the control circuitry 120 to detect stuck-open defects of the HZ Mux 220.

The third sampling cycle 580 begins after the third time period 588 of the second sampling cycle 580. Thus, the third sampling cycle 590 partially overlaps with the second sampling cycle 580. During the third sampling cycle 590, the ADC circuit 200 is configured to sample a diagnostic channel. For instance, one of the diagnostic channels 224 is selected for the sampling circuit 300. During a first time period 594 within the third sampling cycle 590, the HZ Mux 220 is turned on for receiving a diagnostic analog input signal after the HZ Mux 220 exits the ground reset state 517. Meanwhile, the LZ Mux 240 is turned on for receiving the selected diagnostic channel from the HZ Mux 220. To that effect, the second switch control signal 514 and the DGN switch control signal 532 each has a high value whereas the first switch control signal 512, the third switch control signal 516, and the ND switch control signal 534 each has a low value.

During the first time period 594, the sampling circuit 300 has substantially the same switching activities as in the first time period 584 of the first sampling cycle 580. As the first reception channel 222 is previously sampled, the ADC core circuit 130 enters a HZ Conversion state to perform step 422 of the method 400. In particular, the sampling circuit 300 cooperates with the control circuitry 120 to convert the previously sampled channel while being isolated from the selected channel. To that effect, the REF switch control signal 554 and the GND switch control signal 556 are toggled during the first time period 584. With the converted output (which is carried by the sampling monitor signal 106), the control circuitry 120 can detect stuck-open defects as described above.

A second time period 596 of the second sampling cycle 590 begins towards the tail end of the first time period 594. And the second time period 596 partially overlaps with the first time period 594. During the second time period 596, the ADC core circuit 130 has substantially the same switching activities as in the second time period 586 of the second sampling cycle 580.

A third time period 598 of the second sampling cycle 590 begins after the second time period 596. The third time period 598 is outside of the first time period 594. During the third time period 598, the ADC core circuit 130 enters a sampling state for performing step 426 of the method 400. In the sampling state, the sampling circuit 300 is configured to sample the selected channel (e.g., the diagnostic channel 224). To actuate the sampling state, the AIN switch control signal 552 turns high while the GND switch control signal 556 turns low. As a result, the sampling capacitors 320 are coupled with the selected channel via the analog input port 301, the LZ Mux 240, and the HZ Mux 220.

The first, second, and third sampling cycles (i.e., 570, 580, and 590) can be performed by the ADC circuit 200 in a recursive manner consistent with the method 400 as described in FIG. 4. After the third sampling cycles, the ADC core circuit 130 enters a Diagnostic Conversion state to perform step 422 of the method 400. In particular, the sampling circuit 300 cooperates with the control circuitry 120 to convert the previously sampled channel while being isolated from the selected channel. With the converted output (which is carried by the sampling monitor signal 106), the control circuitry 120 can detect stuck-open defects as well as stuck-closed defects when the converted output deviates from the expected value of the selected diagnostic channel.

FIG. 5B is a timing diagram illustrating the sampling cycles of the exemplary ADC 200 according to another aspect of the present disclosure. FIG. 5B illustrates substantially the same switching activities as shown in FIG. 5A except for the reset states of the HZ Mux 220 and the ADC Core circuit 130. Instead of entering a ground reset state 517, the HZ Mux 220 enters a reference reset state 519. Within the reference reset state 519, the $REF_G$ switch control signal 516 stays low while the $REF_H$ switch control signal 518 turns high. As a result, the high impedance output 232 is reset with a reference voltage that has a non-zero value. By alternating between the ground reset state 517 and the reference reset state 519, the data pattern associated with the digital output of the ADC core circuit 130 becomes more distinct when a stuck-open defect occurs within the HZ Mux 220. Thus, the control circuitry 120 can detect HZ Mux 220 related stuck-open defects with better accuracy.

Similarly, the ADC core circuit 130 enters a reference reset state 555 instead of a ground reset state 557. Within the reference reset state 555, the GND switch control signal 558 stays low while the REF switch control signal 554 turns high. As a result, the analog input signal 107, as well as the sampling capacitors 320, are reset with a reference voltage that has a non-zero value. By alternating between the ground reset state 557 and the reference reset state 555, the data pattern associated with the digital output of the ADC core circuit 130 becomes more distinct when a stuck-open defect occurs within the LZ Mux 240. Thus, the control circuitry 120 can detect LZ Mux 240 related stuck-open defects with better accuracy.

Figure 6:
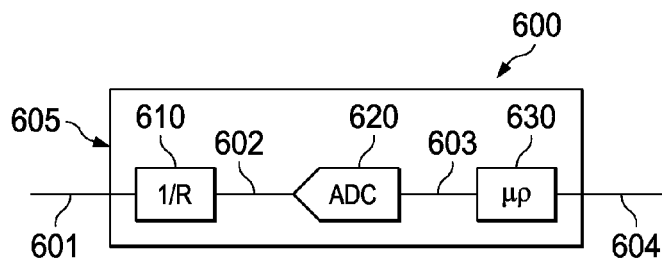
FIG. 6 shows a schematic view of an exemplary car battery monitoring system incorporated with an ADC circuit according to an aspect of the present disclosure.

FIG. 6 shows a schematic view of an exemplary car battery monitoring system 600 incorporated with an ADC circuit 620 according to an aspect of the present disclosure. The car battery monitoring system 600 is configured to monitor the output voltage level of a car battery and generate a warning signal when the output voltage level is out of its expected range. The car battery monitoring system 600 can be formed on a module printed circuit board (PCB) 605. The PCB 605 provides an interface for receiving and connecting various integrated circuits, which include but are not limited to an analog circuit 610 equipped with voltage dividing capability, an ADC circuit 620, and a microprocessor 630.

The analog circuit 610 has a high voltage input that is configured to receive an output voltage 601 of a car battery. The analog circuit 610 also includes a voltage divider circuit for stepping down the output voltage 601. As a result, the analog circuit 610 can generate a divided output voltage 602 representing the output voltage of the car battery. The ADC circuit 620 is coupled with the analog circuit 610 via connecting wires formed on the PCB 605. These connecting wires typically exhibit high impedance relative to the internal circuitry of the ADC circuit 620. In one implementation, the ADC circuit 620 can be implemented by the ADC circuit 200 and according to the descriptions of FIGS. 2-4 and 5A-5B. To minimize the impact of the high impedance connecting wires, the ADC circuit 620 is configured to receive the divided output voltage 602 using a high impedance multiplexer (e.g., 220) and via one of the high impedance reception channels (e.g., the first reception channel group 222).

Upon sampling the divided output voltage 602 over a few sampling cycles (see, e.g., FIGS. 5A-5B), the ADC circuit 620 will generate a series of digital output signals 603, each representing the digital value of the output voltage 601 of the car battery at a discrete point of time. The ADC circuit 620 is configured to detect stuck-open and stuck-close defects during its regular sampling cycles and diagnostic sampling cycles. When the ADC circuit 620 detects any one of the stuck-open defect or stuck-close defect, the ADC circuit 620 may output the defect detection data to the digital output signals 603.

The microprocessor 630 is connected with the ADC circuit 620 for receiving the digital output signals 603. The microprocessor 630 executes programming instructions to interpret and examine the data carried by the digital output signals 603. Based on such interpretation and examination, the microprocessor 630 generates a feedback signal 604 for controlling and regulating the functionalities of the car battery. For instance, a car battery typically delivers an output voltage (e.g., 601) ranges between 12V to 14V. Under some operations, the output voltage can go as high as 40V and as low as 4.5V. Thus, the ADC circuit 620 can scale the battery output voltage in the order of 25V, which can be stepped down by a factor of ⅕ by the analog circuit 610. Therefore, an output voltage of 25V or higher can be mapped to a 5V ADC input, whereas an output voltage of 4.5V can be mapped to a 900 mV ADC input. Under this scale, the car battery monitoring system 600 may declare a battery fault when the digital output signal (e.g., 603) carries a digital value representing a car battery output voltage of 500 mV or less. Accordingly, the ADC circuit 620 may reset its multiplexer (e.g., the HZ Mux 220 and the LZ Mux 240) with a 0V reference voltage after each sampling cycle (see, e.g., FIGS. 4 and 5A-5B).

Figure 7:
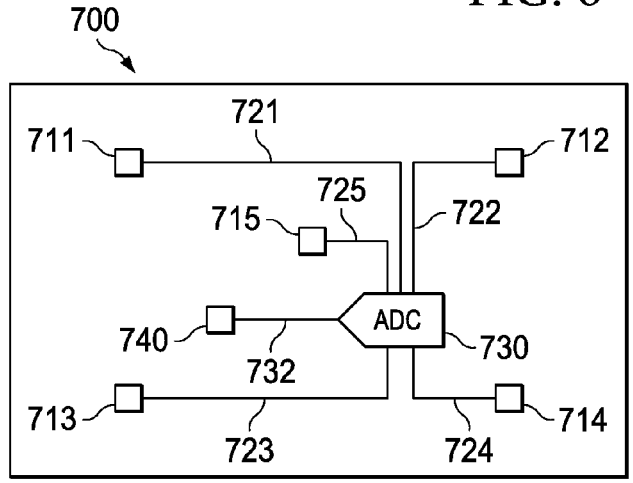
FIG. 7 shows a schematic view of an exemplary integrated circuit including on-chip temperature sensors interfacing with an ADC circuit according to an aspect of the present disclosure.

FIG. 7 shows a schematic view of an exemplary integrated circuit 700 including on-chip temperature sensors (711, 712, 713, 714, and 715) interfacing with an ADC circuit 730 according to an aspect of the present disclosure. The on-chip temperature sensors 711, 712, 713, 714, and 715 are positioned and configured to sense the die temperature at various locations of the integrated circuit 700. Each of the on-chip temperature sensors 711, 712, 713, 714, and 715 can be implemented using an on-chip diode that generates a voltage proportional to the temperature of a chip location at which the particular temperature sensor is positioned.

In one implementation, for example, the integrated circuit (IC) 700 may include five on-chip temperature sensors (OCTS): a first OCTS 711 for measuring the on-chip temperature of the top-left corner of the IC 700; a second OCTS 712 for measuring the on-chip temperature of the top-right corner of the IC 700; a third OCTS 713 for measuring the on-chip temperature of the bottom-left corner of the IC 700; a fourth OCTS 714 for measuring the on-chip temperature of the bottom-right corner of the IC 700; and a fifth OCTS 715 for measuring the on-chip temperature of the center of the IC 700.

The IC 700 includes an ADC circuit 730 for converting the analog outputs of the OCTS to digital outputs. The ADC circuit 730 is coupled with the OCTS (i.e., 711, 712, 713, 714, and 715) via interconnects (i.e., 721, 722, 723, 724, and 725), each of which includes one or more metal layers and/or polysilicon layers formed inside of the IC 700. These interconnects layers generally exhibit lower impedance relative to the external connections of the IC 700. In one implementation, the ADC circuit 730 can be implemented by the ADC circuit 200 and according to the descriptions of FIGS. 2-4 and 5A-5B. To minimize the impact of the impedance of these interconnects layers, the ADC circuit 730 is configured to receive the sensed temperatures using a low impedance multiplexer (e.g., 240) and via multiple low impedance reception channels (e.g., the second reception channel group 246).

Upon sampling the sensed temperatures over a few sampling cycles (see, e.g., FIGS. 5A-5B), the ADC circuit 730 will generate a series of digital output signals 732, each representing the digital value of the sensed temperature at a location of the IC 700. The ADC circuit 730 is configured to detect stuck-open and stuck-close defects during its regular sampling cycles and diagnostic sampling cycles. When the ADC circuit 730 detects any one of the stuck-open defect or stuck-close defect, the ADC circuit 730 may output the defect detection data to the digital output signals 732.

The IC 700 also includes a processing module 740 that monitors and responds to the digitized versions of the sensed temperatures. The processing module 740 is connected with the ADC circuit 730 for receiving the digital output signals 732. The processing module 740 executes programming instructions to interpret and examine the data carried by the digital output signals 732. Based on such interpretation and examination, the processing module 740 may regulate the circuit activities of a particular region of the IC 700. For instance, the temperature coefficient of a temperature sensing diode is about −2 mV/C. At room temperature, the voltage across a temperature sensing diode is about 0.7V. In an implementation where each temperature sensor (e.g., 711, 712, 713, 714, and 715) comprises two temperature sensing diodes, the temperature sensor will generate a 1.4V output voltage at room temperature.

Under regular operations, the temperature of the IC 700 can go as high as 300 C, which corresponds to an output voltage of 300 mV, and as low as −60 C, which corresponds to 1.748V. Thus, the processing module 740 may declare a temperature fault when the digital output signal (e.g., 732) carries a digital value representing a voltage that is above 2V or below 200 mV. Accordingly, the ADC circuit 730 may reset its multiplexer (e.g., the HZ Mux 220 and the LZ Mux 240) with a reference voltage alternating between 0V and 5V (see, e.g., FIGS. 4 and 5A-5B).

Figure 8:
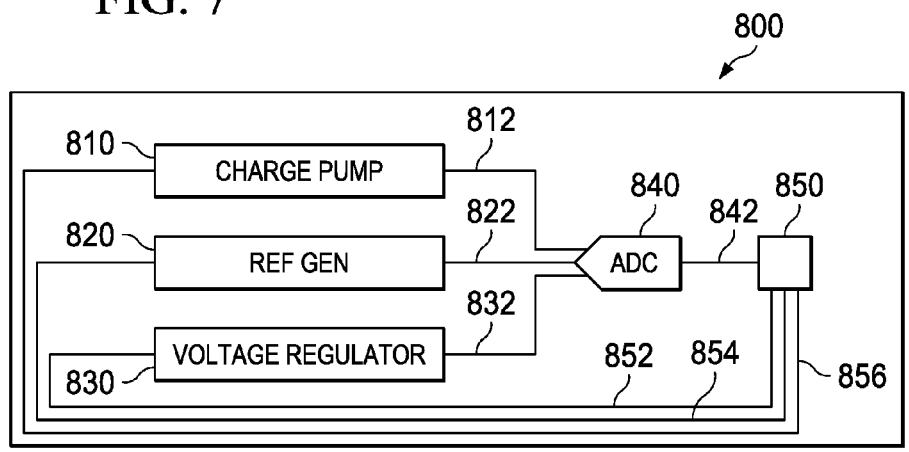
FIG. 8 shows a schematic view of an exemplary integrated circuit including analog circuitries interfacing with an ADC circuit according to an aspect of the present disclosure.

FIG. 8 shows a schematic view of an exemplary integrated circuit (IC) 800 including analog circuitries (e.g., 810, 820, and 830) interfacing with an ADC circuit 840 according to an aspect of the present disclosure. The analog circuitries are structured and configured to perform one or more analog operations. The ADC circuit 840 is coupled with these analog circuitries to verify the accuracy of the respective analog operations. The ADC circuit 840 can be implemented by the ADC circuit 200 and according to the descriptions of FIGS. 2-4 and 5A-5B. The couplings between the ADC circuit 840 and the analog circuitries include interconnects established by one or more metal layers and/or polysilicon layers formed inside of the IC 800. These interconnects layers generally exhibit lower impedance relative to the external connections of the IC 800. To minimize the impact of the impedance of these interconnects layers, the ADC circuit 840 is configured to receive analog input signals from the analog circuitries using a low impedance multiplexer (e.g., 240) and via multiple low impedance reception channels (e.g., the second reception channel group 246).

In one implementation, the analog circuitries include a charge pump 810 for generating a high voltage output exceeding the internal supply voltage. The charge pump voltage can be stepped down to a divided charge pump voltage 812 by using a voltage divider. The ADC circuit 840 is coupled with the charge pump 810 for receiving the divided charge pump voltage 812. The ADC circuit 840 generates a digital output signal 842 that represents the voltage level of the divided charge pump voltage 812. The IC 800 includes a processing module 850 that is coupled with the ADC circuit 840. The processing module 850 receives the digital output signal 842 from the ADC circuit 840. Upon interpreting and examining the digital output signal 842, the processing module 850 generates a charge pump feedback signal 856 for adjusting the charge pump voltage of the charge pump 810. Because the analog input to the ADC circuit 840 shares a range that is similar to the ADC circuit 620 as described in FIG. 6. Thus, the ADC circuit 840 may reset its multiplexer (e.g., the HZ Mux 220 and the LZ Mux 240) with a 0V reference voltage after each sampling cycle (see, e.g., FIGS. 4 and 5A-5B).

In another implementation, the analog circuitries include a reference voltage generator 820 for generating internal bandgap reference voltages. The ADC circuit 840 is coupled with the reference voltage generator 820 for receiving one or more bandgap reference voltages. The ADC circuit 840 generates a digital output signal 842 that represents the voltage level of a particular bandgap reference voltage 822. The processing module 850 receives the digital output signal 842 from the ADC circuit 840. Upon interpreting and examining the digital output signal 842, the processing module 850 generates a reference generator feedback signal 854 for adjusting the internal bandgap reference voltages of the charge pump 810. These bandgap reference voltages vary around 1.25V and may ranges from 1V to 2.5V. However, these bandgap reference voltages typically will not be set too close to the 0V and 5V boundaries. Thus, the ADC circuit 840 may reset its multiplexer (e.g., the HZ Mux 220 and the LZ Mux 240) with a reference voltage alternating between 0V and 5V for detecting stuck-open and stuck-close defects after each sampling cycle (see, e.g., FIGS. 4 and 5A-5B).

In yet another implementation, the analog circuitries include a voltage regulator 830 for generating one or more internal supply voltages (e.g., VDD, VCC, and VSS). The ADC circuit 840 is coupled with the reference voltage generator 820 for receiving one or more internal supply voltages 832. The ADC circuit 840 generates a digital output signal 842 that represents the voltage level of a particular supply voltage 822. The processing module 850 receives the digital output signal 842 from the ADC circuit 840. Upon interpreting and examining the digital output signal 842, the processing module 850 generates a voltage regulator feedback signal 852 for adjusting the internal supply reference voltages of the voltage regulator 830. These internal supply voltages 832 can be set at 5V, 3.3V, 1.5V, 1.1V, or 0V. Typically the range of tolerance of these supply voltages 832 is in the order of plus or minus 5%. Excluding the case of a VSS voltage regulator, a power-on voltage regulator 830 is at fault when it delivers a supply voltage of 100 mV or less. In that case, the ADC circuit 840 may reset its multiplexer (e.g., the HZ Mux 220 and the LZ Mux 240) with a 0V reference voltage after each sampling cycle (see, e.g., FIGS. 4 and 5A-5B). For a VSS voltage regulator, the ADC circuit 840 may reset its multiplexer (e.g., the HZ Mux 220 and the LZ Mux 240) with a 5V reference voltage after each sampling cycle (see, e.g., FIGS. 4 and 5A-5B).

Figure 9:
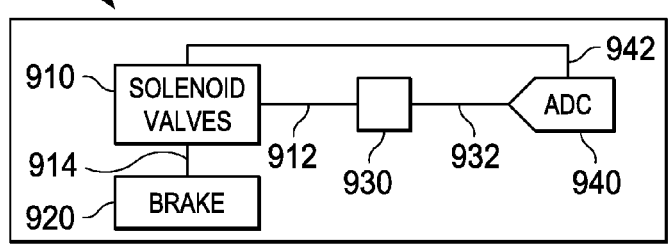
FIG. 9 shows a schematic view of an exemplary brake control system incorporated with an ADC circuit according to an aspect of the present disclosure.

FIG. 9 shows a schematic view of an exemplary brake control system 900 incorporated with an ADC circuit 940 according to an aspect of the present disclosure. The brake control system 900 includes a brake system 920, solenoid valves 910, a current monitoring system 930, and the ADC circuit 940. The brake system 920 converts hydraulic pressure 914 to a braking force for decelerating a motor vehicle. The solenoid valves 910 control the hydraulic pressure 914 within the brake system 920 to regulate the brake operation. The current monitoring system 930 is coupled with the solenoid valves 910 to measure a closed loop current 912 in the solenoid valves 910. In general, the closed loop current 912 can be adjusted to change the hydraulic pressure 914 within the brake system 920. Based on the current measurement, the current monitoring system 930 generates a current monitoring signal 932.

The ADC circuit 940 is coupled with the current monitoring system 930. The ADC circuit 940 can be implemented by the ADC circuit 200 and according to the description of FIGS. 2-4 and 5A-5B. Depending on the particular circuit design, the ADC circuit 940 and the current monitoring system 930 can be formed within a single integrated circuit or two integrated circuits.

In the event that the ADC circuit 940 and the current monitoring system 930 are formed within a single integrated circuit, the ADC circuit 940 is coupled with the current monitoring system 930 via interconnects established by one or more metal layers and/or polysilicon layers. These interconnects layers generally exhibit lower impedance relative to the external connections of the ADC circuit 940. To minimize the impact of the impedance of these interconnects layers, the ADC circuit 940 is configured to receive the current monitoring signal 932 using a low impedance multiplexer (e.g., 240) and via multiple low impedance reception channels (e.g., the second reception channel group 246).

In the event that the ADC circuit 940 and the current monitoring system 930 are formed within two integrated circuits, the ADC circuit 940 and the current monitoring system 930 are connected with each other via external lead wires and bonding pads. These external connections typically exhibit high impedance relative to the internal circuitry of the ADC circuit 940. To minimize the impact of the high impedance connections, the ADC circuit 640 is configured to receive the current monitoring signal 932 using a high impedance multiplexer (e.g., 220) and via one of the high impedance reception channels (e.g., the first reception channel group 222).

The ADC circuit 940 samples the current monitoring signal 932 and convert it to a digital output signal 942. The ADC circuit 940 delivers the digital output signal 942 back to the solenoid valves 910 for adjusting the hydraulic pressure during various brake operations, including anti-lock braking, brake stability control, and automatic cruise control. Because the voltage range of the current monitoring signal 932 is likely to span the full input range of the ADC circuit 940, the ADC circuit 940 may reset its multiplexer (e.g., the HZ Mux 220 and the LZ Mux 240) with a reference voltage alternating between 0V and 5V (see, e.g., FIGS. 4 and 5A-5B) for detecting stuck-open and stuck-close defects.

The ADC fault detection systems and methods described above can be implemented by system firmware and/or system software. The ADC fault detection systems and methods compare the expected digital values of the diagnostic channels with the converted digital values of the diagnostic channels over a series of sampling cycles. To that end, the ADC fault detection systems and methods are able to constantly and continuously monitor open-MUX faults (e.g., stuck-open defects) and close-MUX faults (e.g., stuck-close defects) within a tolerance range of the ADC circuit.

An exemplary ADC circuit may have three diagnostic channels, each having a tolerance range of plus and minus 50 mV. The reference voltages of these three diagnostic channels can be preset to 0V, 2.5V, and 5V. During a diagnostic sampling cycle of the 0V diagnostic channel, for example, the ADC circuit will issue a no-fault status in its digital output if the converted value of the 0V diagnostic channel is within the range of 0V to 50 mV. Otherwise, the ADC circuit may issue an ADC-fault (e.g., stuck-open or stuck close defect). During a diagnostic sampling cycle of the 2.5V diagnostic channel, for example, the ADC circuit will issue a no-fault status in its digital output if the converted value of the 2.5V diagnostic channel is within the range of 2.45V to 2.55V. Otherwise, the ADC circuit may issue an ADC-fault. Similarly, the ADC circuit will issue a no-fault status if the converted value of the 5V diagnostic channel is within the range of 4.95V to 5V, and it will issue an ADC-fault if the converted value is outside of this range.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the methods and/or operations described (such as a program encoded in a computer-readable medium, which can be a memory device, a storage device, a machine-readable storage substrate, or other physical, machine-readable medium, or a combination of one or more of them).

The term "apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

A program (also known as a computer program, software, software application, script, or code) can be written in any form of programming language, including compiled or interpreted languages, or declarative or procedural languages, and it can be deployed in any form, including as a standalone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. An analog-to-digital converter (ADC), comprising:
a sampling circuit having a fault tolerance range; and
a channel selector having:
   a reception channel having a channel impedance;
   a diagnostic channel;
   a switch coupled with the reception channel and the diagnostic channel, and configured to select the reception channel or the diagnostic channel for the sampling circuit; and
   an impedance compensator coupled with the switch, the impedance compensator having a compensatory impedance equal to or greater than a product of the channel impedance and the fault tolerance range.

2. The ADC of claim 1, wherein the impedance compensator is coupled in series between the switch and the sampling circuit.

3. The ADC of claim 1, wherein the impedance compensator is coupled in series between the diagnostic channel and the switch.

4. The ADC of claim 1, wherein the impedance compensator is configured to offset the channel impedance of the reception channel based on the fault tolerance range of the sampling circuit and when the diagnostic channel is selected.

5. The ADC of claim 1, wherein:
the reception channel includes a first reception channel and a second reception channel, the first reception channel has a high channel impedance and the second reception channel has a low channel impedance lower than the high channel impedance; and
the impedance compensator is structured and routed to offset only the high channel impedance.

6. The ADC of claim 5, wherein the switch includes:
a first switch coupled with the first reception channel and a buffered channel;
a second switch coupled with the diagnostic channel and the impedance compensator, and the second switch coupled with the buffered channel;
a third switch coupled with the second reception channel and the sampling circuit; and
a fourth switch coupled with the buffered channel and the sampling circuit.

7. The ADC of claim 6, wherein the channel selector includes a buffer having an input coupled with the first and second switches, and an output coupled with the fourth switch via the buffered channel, the buffer configured to:
amplify a high impedance signal defined by the first switch and the second switch; and
deliver the amplified signal to the buffered channel.

8. The ADC of claim 7, further comprising:
a reference channel configured to provide a reference voltage for periodically resetting the input of the buffer; and
a reference switch configured to periodically couple the reference channel to the input of the buffer after a sampling cycle of the sampling circuit.

9. The ADC of claim 6, wherein the channel selector includes a supplementary impedance compensator coupled with the fourth switch, the supplementary impedance compensator structured and routed to offset the low channel impedance of the second reception channel based on the fault tolerance range of the sampling circuit and when the diagnostic channel is selected.

10. The ADC of claim 9, wherein the fourth switch includes:
a fifth switch configured to couple the supplementary impedance compensator in series between the buffered channel and the sampling circuit when the diagnostic channel is selected; and a sixth switch coupled with the buffered channel, and configured to link the buffered channel with the sampling circuit when the first reception channel is selected.

11. A channel selector for use in an analog-to-digital converter having a sampling circuit configured to convert an analog input to a digital output within a fault tolerance range, the channel selector comprising:
a reception channel having a first channel impedance;
a first switch coupled between the reception channel and the sampling circuit;
a diagnostic channel coupled with the sampling circuit;
a second switch coupled between the diagnostic channel and the sampling circuit; and
an impedance compensator configured to offset the first channel impedance of the reception channel based on the fault tolerance range of the sampling circuit and when the diagnostic channel is selectively coupled to the sampling circuit.

12. The channel selector of claim 11, wherein the impedance compensator is coupled in series with the diagnostic channel and the second switch, the impedance compensator having a compensatory impedance equal to or greater than a product of the first channel impedance and the fault tolerance range.

13. The channel selector of claim 11, further comprising:
a second reception channel having a second channel impedance below the first channel impedance;
a third switch coupled between the second reception channel and the sampling circuit;
a buffer having an input coupled with the first switch and the second switch, the buffer configured to amplifier a high impedance signal defined by the first and second switches, and configured to deliver the amplified signal to a buffered channel; and
a fourth switch coupled with the buffered channel, and configured to selectively couple the buffered channel with the sampling circuit when the second reception channel is not selected.

14. The channel selector of claim 13, further comprising:
a reference channel configured to provide a reference voltage for periodically resetting the input of the buffer; and
a reference switch configured to periodically couple the reference channel to the input of the buffer after a sampling cycle of the sampling circuit.

15. The channel selector of claim 13, further comprising:
a supplementary impedance compensator coupled with the fourth switch, the supplementary impedance compensator structured and routed to offset the second channel impedance of the second reception channel based on the fault tolerance range of the sampling circuit and when the diagnostic channel is selected.

16. A method for verifying a digital output of an analog-to-digital converter (ADC) having a channel selector configured to select a channel for providing an analog input, and a sampling circuit configured to convert the analog input to the digital output, the method comprising:
isolating the sampling circuit from the selected channel during a first time period;
resetting the sampling circuit during a second time period partially overlapping with the first time period; and
coupling the sampling circuit with the channel selector during a third time period after the second time period and outside of the first time period.

17. The method of claim 16, further comprising:
resetting a high impedance output of the channel selector during a fourth time period after the third time period and partially overlapping with the first time period.

18. The method of claim 16, wherein resetting the sampling circuit includes:
periodically charging an input capacitor of the sampling circuit to a reference voltage during the second time periods in succession.

19. The method of claim 18, wherein the reference voltage alternates between 0V and a non-zero voltage during the successive second time periods.

20. The method of claim 18, wherein the reference voltage is beyond a voltage range of the selected channel.

21. A device for verifying a digital output of an analog-to-digital converter (ADC), the device comprising:
means for isolating a sampling circuit from a selected channel during a first time period;
means for resetting the sampling circuit during a second time period partially overlapping with the first time period; and
means for coupling the sampling circuit with a channel selector during a third time period after the second time period and outside of the first time period.

22. The device of claim 21, further comprising:
means for resetting a high impedance output of the channel selector during a fourth time period after the third time period and partially overlapping with the first time period.

23. The device of claim 21, wherein the means for resetting the sampling circuit includes:
means for periodically charging an input capacitor of the sampling circuit to a reference voltage during the second time periods in succession.

24. The device of claim 23, wherein the reference voltage alternates between 0V and a non-zero voltage during the successive second time periods.

25. The device of claim 23, wherein the reference voltage is beyond a voltage range of the selected channel.

* * * * *